(12) United States Patent
Yamauchi et al.

(10) Patent No.: US 11,837,444 B2
(45) Date of Patent: Dec. 5, 2023

(54) SUBSTRATE JOINING METHOD, SUBSTRATE JOINING SYSTEM AND METHOD FOR CONTROLLING HYDROPHILIC TREATMENT DEVICE

(71) Applicants: BONDTECH CO., LTD., Kyoto (JP); Tadatomo Suga, Tokyo (JP)

(72) Inventors: Akira Yamauchi, Kyoto (JP); Tadatomo Suga, Tokyo (JP)

(73) Assignees: Tadatomo Suga, Tokyo (JP); BONDTECH CO., LTD., Kyoto (JP)

( * ) Notice: Subject to any disclaimer, the term of this patent is extended or adjusted under 35 U.S.C. 154(b) by 1222 days.

(21) Appl. No.: 16/347,590

(22) PCT Filed: Nov. 6, 2017

(86) PCT No.: PCT/JP2017/039939
§ 371 (c)(1),
(2) Date: Jun. 25, 2019

(87) PCT Pub. No.: WO2018/084285
PCT Pub. Date: May 11, 2018

(65) Prior Publication Data
US 2023/0136771 A1    May 4, 2023

(30) Foreign Application Priority Data
Nov. 7, 2016 (JP) ................. 2016-217582

(51) Int. Cl.
H01J 37/32    (2006.01)
(52) U.S. Cl.
CPC ... *H01J 37/32449* (2013.01); *H01J 37/32816* (2013.01); *H01J 2237/201* (2013.01); *H01J 2237/338* (2013.01); *H01J 2237/3341* (2013.01)

(58) Field of Classification Search
None
See application file for complete search history.

(56) References Cited

U.S. PATENT DOCUMENTS

| 2005/0173057 A1 | 8/2005 | Suga et al. |
| 2006/0141745 A1* | 6/2006 | Yang ................ B81C 3/001 438/455 |

(Continued)

FOREIGN PATENT DOCUMENTS

| JP | 2005-079353 A | 3/2005 |
| JP | 2011-249643 A | 12/2011 |
| JP | 2015-211130 A | 11/2015 |

OTHER PUBLICATIONS

Japanese Office Action dated Apr. 10, 2018 for Japanese application No. 2018-502287 (along with Translation).

*Primary Examiner* — Allan W. Olsen
(74) *Attorney, Agent, or Firm* — ASLAN LAW, P.C.

(57) ABSTRACT

The substrate joining method is a substrate joining method for joying two substrates, including a hydrophilic treatment step of hydrophilizing at least one of respective joint surfaces of the two substrates that are to be joined to each other and a joining step of joining the two substrates after the hydrophilic treatment step. The hydrophilic treatment step includes a step of performing a $N_2$ RIE treatment to perform reactive ion etching using $N_2$ gas on the joint surfaces of the substrates and a step of performing a $N_2$ radical treatment to irradiate the joint surfaces of the substrates with $N_2$ radicals after the step of performing the $N_2$ RIE treatment.

17 Claims, 26 Drawing Sheets

(56) References Cited

U.S. PATENT DOCUMENTS

2009/0246537 A1\* 10/2009 Matsuo ................. B41J 2/1623
428/441
2017/0069483 A1\* 3/2017 Razek ............... H01L 21/02046

\* cited by examiner

SAMPLE 1

SAMPLE 2

SAMPLE 3

SAMPLE 4

SAMPLE 5

SAMPLE 6

SAMPLE 7

SAMPLE 8

SAMPLE 9

SAMPLE 10

SAMPLE 11

SAMPLE 12

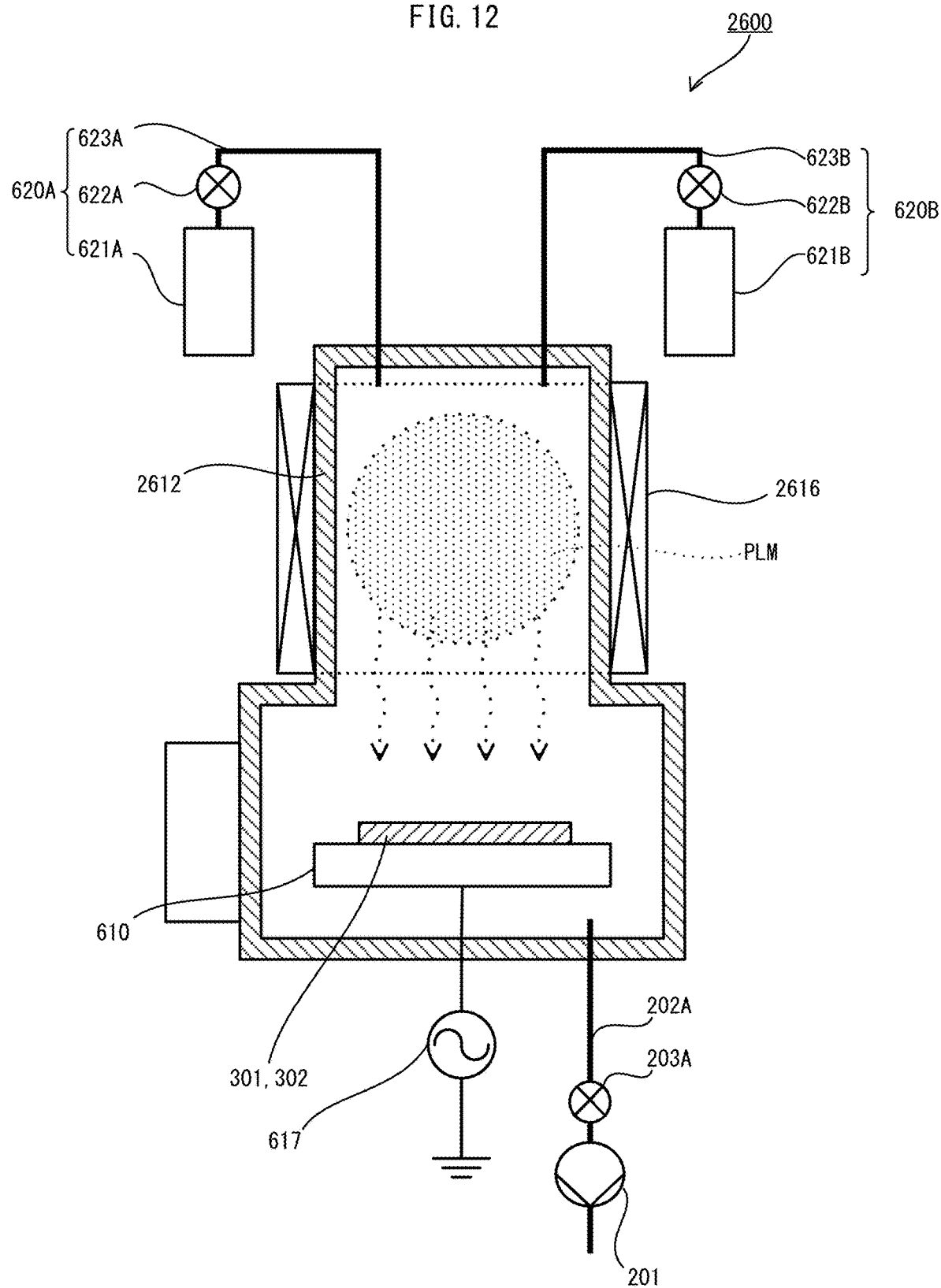

SUBSTRATE JOINING METHOD, SUBSTRATE JOINING SYSTEM AND METHOD FOR CONTROLLING HYDROPHILIC TREATMENT DEVICE

CROSS-REFERENCE TO RELATED APPLICATIONS

This application claims priority to JP Patent Application No. 2016-217582 filed on Nov. 7, 2016, and to PCT Application No. PCT/JP2017/039939 filed on Nov. 6, 2017, the entire contents of which are hereby incorporated by reference.

TECHNICAL FIELD

The present disclosure relates to a substrate joining method, a substrate joining system, and a method for controlling a hydrophilic treatment device.

BACKGROUND ART

In the prior art, hydrophilic joining of substrates is achieved by attaching the substrates together in the atmosphere with water molecules interposed, whereby even if a sufficient amount of OH groups are not produced on the joint surfaces of the original substrates, the water molecules that are interposed between the joint surfaces of substrates can turn into OH groups and then turn into a strong covalent bond through heating. However, the joining in the atmosphere causes large voids due to incorporation of the air. Therefore, it is necessary to employ a joining method of attaching the substrates together while deflecting the substrates in the center. However, this joining method has problems such as distortion in the substrates and deterioration in the accuracy of alignment between the substrates. Moreover, other problems include occurrence of microvoids through heating of the substrates because the substrates are joined with water molecules interposed on the interface of the substrates. Therefore, joining the substrates together in a vacuum makes it possible to prevent air from being incorporated between the substrates so as to reduce occurrence of voids. Furthermore, joining the substrates together in a vacuum results in joining the substrates while expelling water molecules that are present between the substrates, whereby no voids occur. As just stated, the method of joining the substrates together in a vacuum is an effective method of achieving excellent joining between the substrates. However, it is required to produce a sufficient amount of OH groups on the joint surfaces of the substrates in activating the joint surfaces of the substrates before joining the substrates together. Then, the process of activating the joint surfaces of the substrates by an RIE treatment and subsequent exposure to the atmosphere alone as in the prior art does not produce a sufficient amount of OH groups on the joint surfaces of the substrates, whereby the joined substrates will have an insufficient joint strength. With the view of the above, there is a demand fora method of activating the joint surfaces of substrates that makes it possible to produce a sufficient amount of OH groups that endure through the joining in a vacuum.

On the other hand, a substrate joining method for joining two substrates by a combination of reactive ion etching and radical irradiation on the joint surfaces of the two substrates to join has been proposed (for example, see Patent Literature 1). This substrate joining method is a method for joining two substrates together by producing hydroxyl groups (OH groups) on the joint surfaces of the two substrates and bringing into mutual contact and pressurizing the joint surfaces of the two substrates to form the hydrogen bond between the joint surfaces. Then, in this substrate joining method, the joint surfaces of the two substrates to join are exposed to oxygen plasma to perform reactive ion etching, and then, the joint surfaces of the two substrates are irradiated with nitrogen radicals. Subsequently, the joint surfaces of the two substrates are brought into mutual contact and pressurized to join the two substrates.

CITATION LIST

Patent Literature

Patent Literature 1: Unexamined Patent Application Kokai Publication No. 2005-79353

SUMMARY OF INVENTION

Technical Problem

However, in the substrate joining method described in the Patent Literature 1, an insufficient amount of OH groups are produced on the joint surfaces of the two substrates and the joint strength of the two substrates joined may not be sufficient in some cases. Then, there is a demand for a substrate joining method that makes it possible to join two substrates together more solidly by producing a sufficient amount of OH groups on the joint surfaces of the two substrates.

The present disclosure is made with the view of the above reason and an objective of the present disclosure is to provide a substrate joining method, a substrate joining system, and a method for controlling a hydrophilic treatment device that make it possible to join two substrates solidly.

Solution to Problem

In order to achieve the above objective, the substrate joining method according to the present disclosure is a substrate joining method for joining two substrates, including:
- a hydrophilic treatment step of hydrophilizing at least one of respective joint surfaces of the two substrates that are to be joined to each other, and
- a joining step of joining the two substrates after the hydrophilic treatment step,
- wherein the hydrophilic treatment step includes:
- a first etching step of performing reactive ion etching using nitrogen gas on the joint surfaces of the substrates, and
- a radical treatment step of performing a radical treatment to irradiate the joint surfaces of the substrates with nitrogen radicals after the first etching step.

The substrate joining system according to the present disclosure from another aspect is a substrate joining system for joining two substrates, comprising:
- a hydrophilic treatment device configured to perform a hydrophilic treatment to hydrophilize at least one of respective joint surfaces of the two substrates that are to be joined to each other;
- a substrate joining device configured to join the two substrates of which the joint surfaces are subjected to the hydrophilic treatment by the hydrophilic treatment device; and a controller configured to control the hydrophilic treatment device and the substrate joining device,
wherein the hydrophilic treatment device comprises:
a chamber;
a stage configured to support the substrates within the chamber;
a nitrogen gas supplier configured to supply nitrogen gas into the chamber;
a plasma generation source configured to generate plasma and supply radicals in the plasma to the joint surfaces of the substrates that are supported by the stage; and
a bias applier configured to apply a high frequency bias to the substrates that are supported by the stage, and
the controller is configured to
control the nitrogen gas supplier to introduce nitrogen gas into the chamber and then control the bias applier to apply a high frequency bias to the substrates to perform reactive ion etching using nitrogen gas on the joint surfaces of the substrates, and then control the plasma generation source and the bias applier to generate plasma with the nitrogen gas and stop the application of the high frequency bias to the substrates to perform a radical treatment to irradiate the joint surfaces of the substrates with nitrogen radicals.

The method for controlling a hydrophilic treatment device according to the present disclosure from another aspect is a method for controlling a hydrophilic treatment device that comprises a chamber, a stage configured to support substrates within the chamber, a nitrogen gas supplier configured to supply nitrogen gas into the chamber, a plasma generation source configured to generate plasma and supply radicals in the plasma to joint surfaces of the substrates that are supported by the stage, and a bias applier configured to apply a high frequency bias to the substrates that are supported by the stage, including:

a step of introducing nitrogen gas into the chamber by means of the nitrogen gas supplier and then applying a high frequency bias to the substrates by means of the bias applier to perform reactive ion etching using nitrogen gas on the joint surfaces of the substrates, and
a step of generating plasma with nitrogen gas by means of the plasma generation source and stopping the application of the high frequency bias to the substrates by means of the bias applier to perform a radical treatment to irradiate the joint surfaces of the substrates with nitrogen radicals.

Advantageous Effects of Invention

According to the present disclosure, the hydrophilic treatment step includes a first etching step of performing reactive ion etching using nitrogen gas on the joint surfaces of the substrates and a radical treatment step of performing a radical treatment to irradiate the joint surfaces of the substrates with nitrogen radicals after the first etching step. Moreover, the controller according to the present disclosure controls the nitrogen gas supplier to introduce nitrogen gas into the chamber and then controls the bias applier to apply a high frequency bias to the substrates to perform reactive ion etching using nitrogen gas on the joint surfaces of the substrates, and then controls the plasma generation source and the bias applier to generate plasma with nitrogen gas and stop the application of the high frequency bias to the substrates to perform a radical treatment to irradiate the joint surfaces of the substrates with nitrogen radicals. In other words, the reactive ion etching using nitrogen gas serves for nitrogen ions to collide against the joint surfaces of the substrates with a relatively strong collision force to form a large number of sites for OH groups to adhere. Then, the subsequent highly reactive radical treatment with a relatively weak collision force of nitrogen radicals against the joint surfaces of the substrates serves to form sites for OH groups to adhere while suppressing release of the OH groups that have adhered to the sites. As a result, it is possible to efficiently augment adherence of OH groups to the joint surfaces of the substrates and produce a large number of OH groups on the joint surfaces of the substrates. Thus, when the joint surfaces of two substrates are brought into mutual contact to join the two substrates, it is possible to form a large number of hydrogen bonds between the joint surfaces for a large number of OH groups being produced and thus, as the hydrogen bond turns into the covalent bond through a subsequent heating step, improve the joint strength of the substrates that are joined to each other.

BRIEF DESCRIPTION OF DRAWINGS

FIG. 12 is a general configuration diagram that shows part of the hydrophilic treatment device according a modified embodiment.

DESCRIPTION OF EMBODIMENTS

The substrate joining system according to an embodiment of the present disclosure will be described below with reference to the drawings.

The substrate joining system according to this embodiment is a system for joining two substrates by performing a hydrophilic treatment on the joint surfaces of two substrates, bringing the substrates into mutual contact, and then pressurizing and heating the substrates in a chamber under reduced pressure. In the hydrophilic treatment, the joint surfaces of the two substrates are hydrophilized by performing, on the joint surface of each of the two substrates. reactive ion etching using nitrogen gas and a radical treatment to irradiate nitrogen radicals.

Figure 1:
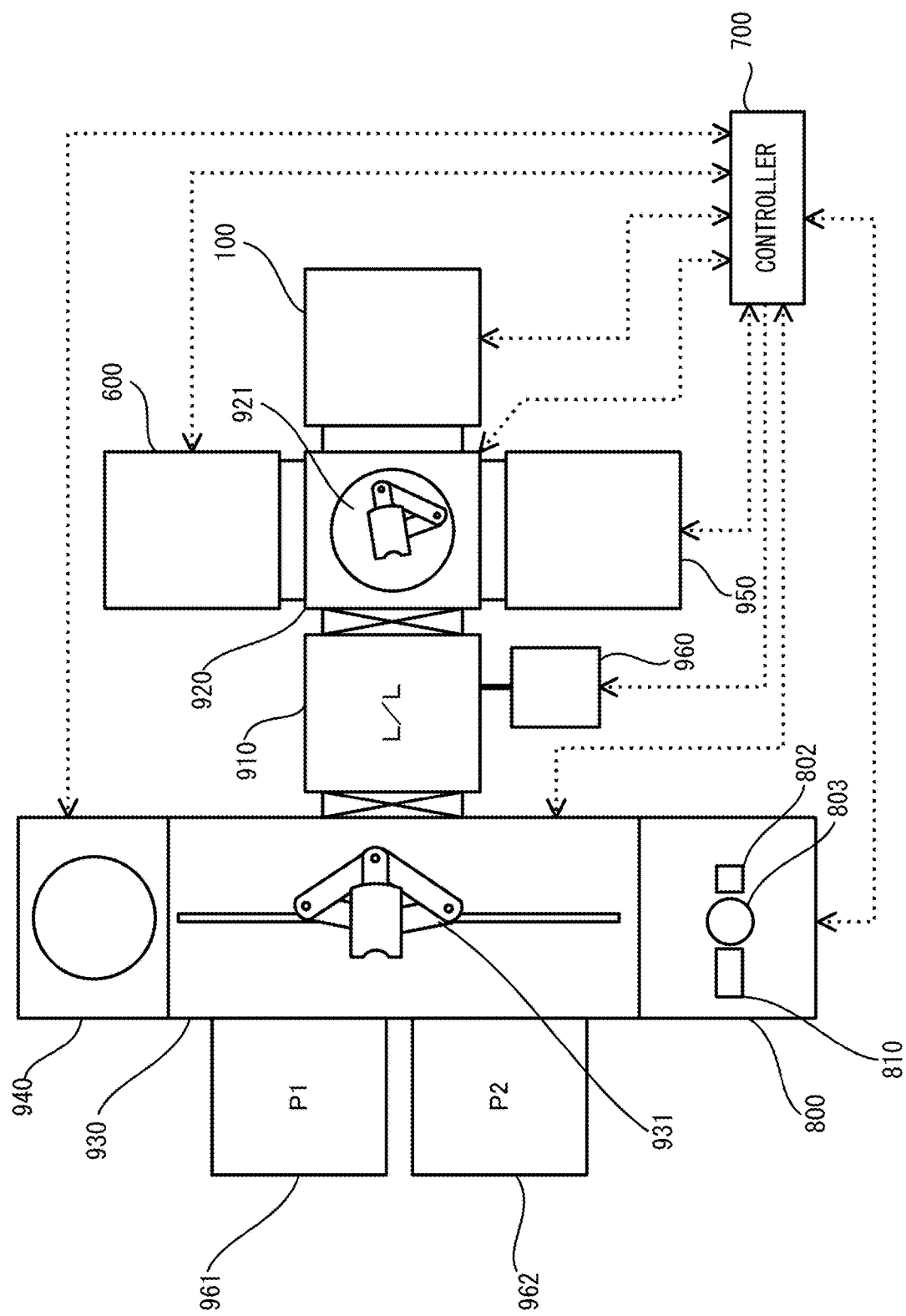
FIG. 1 is a general configuration diagram of the substrate joining system according to an embodiment of the present disclosure.

The substrate joining system, according to this embodiment, comprises, as shown in FIG. 1, an introduction port 961, a retrieval port 962, a first transportation device 930, a cleaning device 940, a contour alignment device 800, a flipping device 950, a hydrophilic treatment device 600, a substrate joining device 100, a second transportation device 920, a controller 700, and a load lock chamber 910. Moreover, a water gas supplier 960 for supplying water gas into the load lock chamber 910 is connected to the load lock chamber 910. The controller 700 controls the first transportation device 930, the cleaning device 940, the contour alignment device 800, the flipping device 950, the hydrophilic treatment device 600, the substrate joining device 100, the second transportation device 920, and the water gas supplier 960. A high efficiency particulate air (HEPA) filter (not shown) is provided in each of the first transportation device 930, the cleaning device 940, and the contour alignment device 800. As a result, an atmospheric environment with a very little particles is established in these devices. On the other hand. a reduced pressure atmosphere is established in the flipping device 950, the hydrophilic treatment device 600, and the substrate joining device 100.

The first transportation device 930 has an atmospheric transportation robot 931 that has an arm for grabbing substrates 301 and 302. The second transportation device 920 also has a vacuum transportation robot 921 that has an arm for grabbing the substrates 301 and 302. The cleaning device 940 cleans the transported substrates 301 and 302 while ejecting water toward the substrates 301 and 302. The contour alignment device 800 has an edge recognition sensor and a substrate thickness measurer and while rotating a stage 803 on which the substrates 301 and 302 are placed, recognizes the edges of the substrates 301 and 302 by means of an edge recognition sensor 810 and measures the thicknesses of the substrates 301 and 302 by means of a substrate thickness measurer 802. The flipping device 950 flips over and holds the transported substrate 302. Then, the vacuum transportation robot 921 can grab the substrate 302 that is flipped over and held by the flipping device 950.

Figure 2:
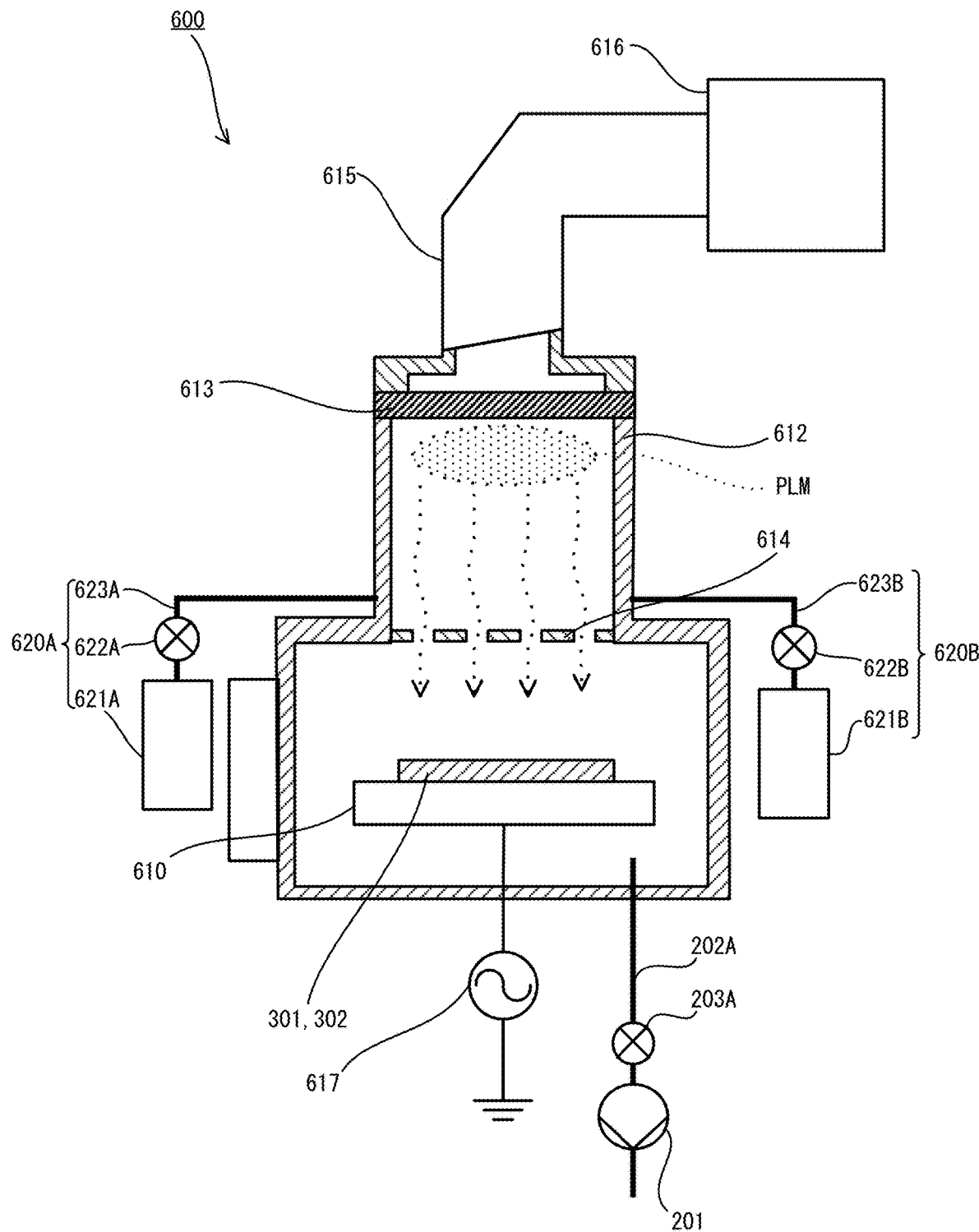
FIG. 2 is a general front view of the hydrophilic treatment device according to the embodiment.

The hydrophilic treatment device 600 performs a hydrophilic treatment to hydrophilize the joint surface of each of the substrates 301 and 302. The hydrophilic treatment device 600 has, as shown in FIG. 2, a stage 610, a chamber 612, a trap plate 614, a waveguide 615, a magnetron 616, and a high frequency power source 617. Moreover, the hydrophilic treatment device 600 has a $N_2$ gas supplier (nitrogen gas supplier) 620A and an $O_2$ gas supplier (oxygen gas supplier) 620B. The $N_2$ gas supplier 620A has a $N_2$ gas reservoir 621A, a supply valve 622A, and a supply pipe 623A. The $O_2$ gas supplier 620B has an $O_2$ gas reservoir 621B, a supply valve 622B, and a supply pipe 623B. The substrates 301 and 302 are placed on the stage 610. The chamber 612 is connected to the waveguide 615 via a glass window 613. The chamber 612 is connected to a vacuum pump 201 via a discharge pipe 202A and a discharge valve 203A. When the vacuum pump 201 is operated with the discharge valve 203A opened, the gas within the chamber 612 is discharged outside the chamber 612 through the discharge pipe 202A and the gas pressure within the chamber 612 is reduced (depressurized).

Microwaves that are generated by the magnetron 616 are introduced into the chamber 612 through the waveguide 615. As the magnetron 616, for example, one that generates microwaves of a frequency of 2.45 GHz can be employed. Then, as the microwaves are introduced from the waveguide 615 with the $N_2$ gas introduced within the chamber 612, the microwaves serve to form plasma PLM within the chamber 612 in the vicinity of the glass window 613. The trap plate 614 traps ions that are contained in the plasma PLM and allows only radicals to flow down to the stage 610. The magnetron 616, the $N_2$ gas supplier 620A, and the trap plate 614 constitute a plasma generation source that generates plasma PLM within the chamber 612 and supplies $N_2$ radicals in the plasma to the joint surfaces of the substrates 301 and 302 that are supported by the stage 610. Here, the explanation is made with regard to the configuration that comprises the magnetron 616 and the waveguide 615 as the hydrophilic treatment device 600. However, this is not restrictive. Instead, a configuration that comprises plate electrodes that are provide on the glass window 613 and a high frequency power source that is electrically connected to the plate electrodes may be contemplated. In such a case, as the high frequency power source, for example, one that applies a high frequency bias of 27 MHz can be employed.

The high frequency power source (the bias applier) 617 applies a high frequency bias to the substrates 301 and 302 that are supported by the stage 610. As the high frequency power source 617, for example, one that generates a high frequency bias of 13.56 MHz can be employed. As juts stated, with a high frequency bias being applied to the substrates 301 and 302 by the high frequency power source 617, a sheath region in which ions that have akinetic energy repeatedly collide against the substrates 301 and 302 occurs in the vicinity of the joint surfaces of the substrates 301 and 302. Then, the ions that are present in the sheath region and have kinetic energy etch the joint surfaces of the substrates 301 and 302.

The water gas supplier 960 has a water gas generation device (not shown). This water gas generation device produces water gas by bubbling in the retained water a carrier gas such as argon (Ar), nitrogen ($N_2$), helium (He), and oxygen ($O_2$). The water gas generation device is connected to the load lock chamber 910 via a supply valve and a supply pipe. The flow rate of the water gas and the carrier gas that are introduced into the load lock chamber 910 is adjusted by controlling the degree of opening of the supply valve. Here, the water gas supplier 960 may be configured to accelerate and eject water ($H_2O$) molecules or clusters toward the joint surfaces of the substrates 301 and 302. Here, the water gas supplier 960 may comprise a particle-beam source that ejects accelerated water ($H_2O$) molecules. In such a case, as the particle beam source, for example, a configuration in which an ultrasonic waves generation element is used to generate water gas may be contemplated. Alternatively, a configuration in which a mixed gas of a carrier gas that is generated by the above-described bubbling, ultrasonic vibration, or the like and water ($H_2O$) is introduced into the above-described particle beam source to generate and eject a water particle beam to the joint surfaces of the substrates 301 and 302 may be contemplated.

The load lock chamber 910 is provided with a cooling device (not shown) for cooling the stage that supports the substrates 301 and 302. Then, for example, for a setting of the humidity being 50% when the temperature is 25° C. within the load lock chamber 910, the cooling device cools the stage to 18° C. so that the humidity in the vicinity of the substrates 301 and 302 that are placed on the stage becomes 80% or so. As a result, it is possible to reduce the amount of water gas that is supplied from the water gas supplier 960 into the load lock chamber 910.

Figure 3:
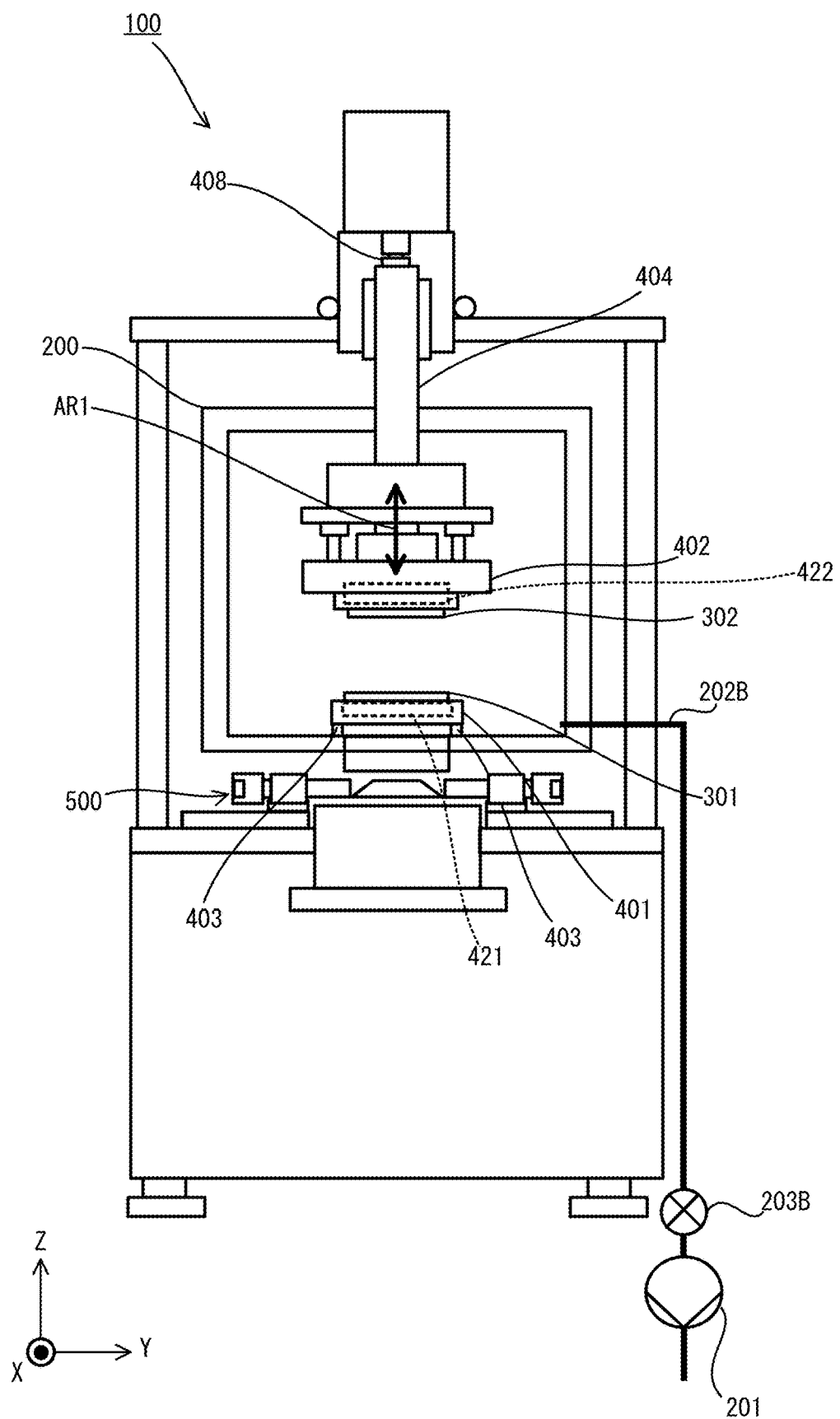
FIG. 3 is a general front view of the substrate joining device according to the embodiment.

The substrate joining device 100 joins the substrates 301 and 302 together that are subjected to the hydrophilic treatment in the hydrophilic treatment device 600. The substrate joining device 100 comprises, as shown in FIG. 3, a chamber 200, a stage 401, a head 402, a stage driver 403, a head driver 404, substrate heaters 421 and 422, and a misalignment amount measurer 500. Here, the following explanation will be made on the assumption that the ±Z direction is the vertical direction and the XY direction is the horizontal direction in FIG. 3 as appropriate. The chamber 200 is connected to the vacuum pump 201 via a discharge pipe 202B and a discharge valve 203B. As the vacuum pump 201 is operated with the discharge valve 203B opened, the gas within the chamber 200 is discharged outside the chamber 200 through the discharge pipe 202B and the gas pressure within the chamber 200 is reduced (depressurized). Moreover, the gas pressure (the degree of vacuum) within the chamber 200 can be adjusted by changing the amount of open/close of the discharge valve 203B and thus adjusting the amount of discharge.

The stage 401 and the head 402 are placed to face each other in the Z direction within the chamber 200. The stage 401 supports the substrate 301 with its top surface, and the head 402 supports the substrate 302 with its bottom surface. Here, the top surface of the stage 401 and the bottom surface of the head 402 may be roughened in consideration of the case in which the contact surfaces of the substrates 301 and 302 with the stage 401 and the head 402 are mirror surfaces and difficult to be released from the stage 401 and the head 402. The stage 401 and the 402 each have a holding mechanism (not shown) for holding the substrate 301 or 302. The holding mechanism comprises an electrostatic chuck or a vacuum chuck.

The stage driver 403 can move the stage 401 in the XY direction and rotate the stage 401 about the Z axis. The head driver 404 moves the head 402 up and down in the vertical direction (see the arrow AR1 in FIG. 3). The head driver 404 moves the head 402 downward to make the head 402 closer to the stage 401. Moreover, the head driver 404 moves the head 402 upward to make the head 402 away from the stage 401. Then, with the substrates 301 and 302 in the state of mutual contact, as the head driver 404 effects on the head 402 a drive force in the direction of moving toward the stage 401, the substrate 302 is pressed against the substrate 301. Moreover, the head driver 404 is provided with a pressure sensor 408 that measures the drive force in the direction of moving toward the stage 401 that is effected by the head driver 404 on the head 402. The measurement of the pressure sensor 408 makes it possible to detect a pressure that acts on the joint surfaces of the substrates 301 and 302 when the substrate 302 is pressed against the substrate 301 by the head driver 404. The pressure sensor 408 comprises, for example, a load cell.

The substrate heaters 421 and 422 comprise, for example, an electrothermal heater. The substrate heaters 421 and 422 transfer heat to the substrates 301 and 302 that are supported by the stage 401 and the head 402 to heat the substrates 301 and 302. Moreover, the temperature of the substrates 301 and 302, and their joint surfaces can be adjusted by adjusting the amount of heat generation of the substrate heaters 421 and 422.

The misalignment amount measurer 500 recognizes the position of a positioning mark (an alignment mark) that is provided to each of the substrates 301 and 302 to measure the amount of horizontal misalignment of the substrate 301 with respect to the substrate 302. The misalignment amount measurer 500 recognizes the alignment marks of the substrates 301 and 302 using, for example, light (for example, infrared light) that is transmitted through the substrates 301 and 302. The stage driver 403 executes the operation of mutual alignment of the substrates 301 and 302 (the alignment operation) by moving in the horizontal direction and/or rotating the stage 401 based on the amount of misalignment that is measured by the misalignment amount measurer 500. The measuring of the amount of misalignment by the misalignment amount measurer 500 and the alignment operation by the stage driver 403 are both executed under the control of the controller 700.

Figure 4:
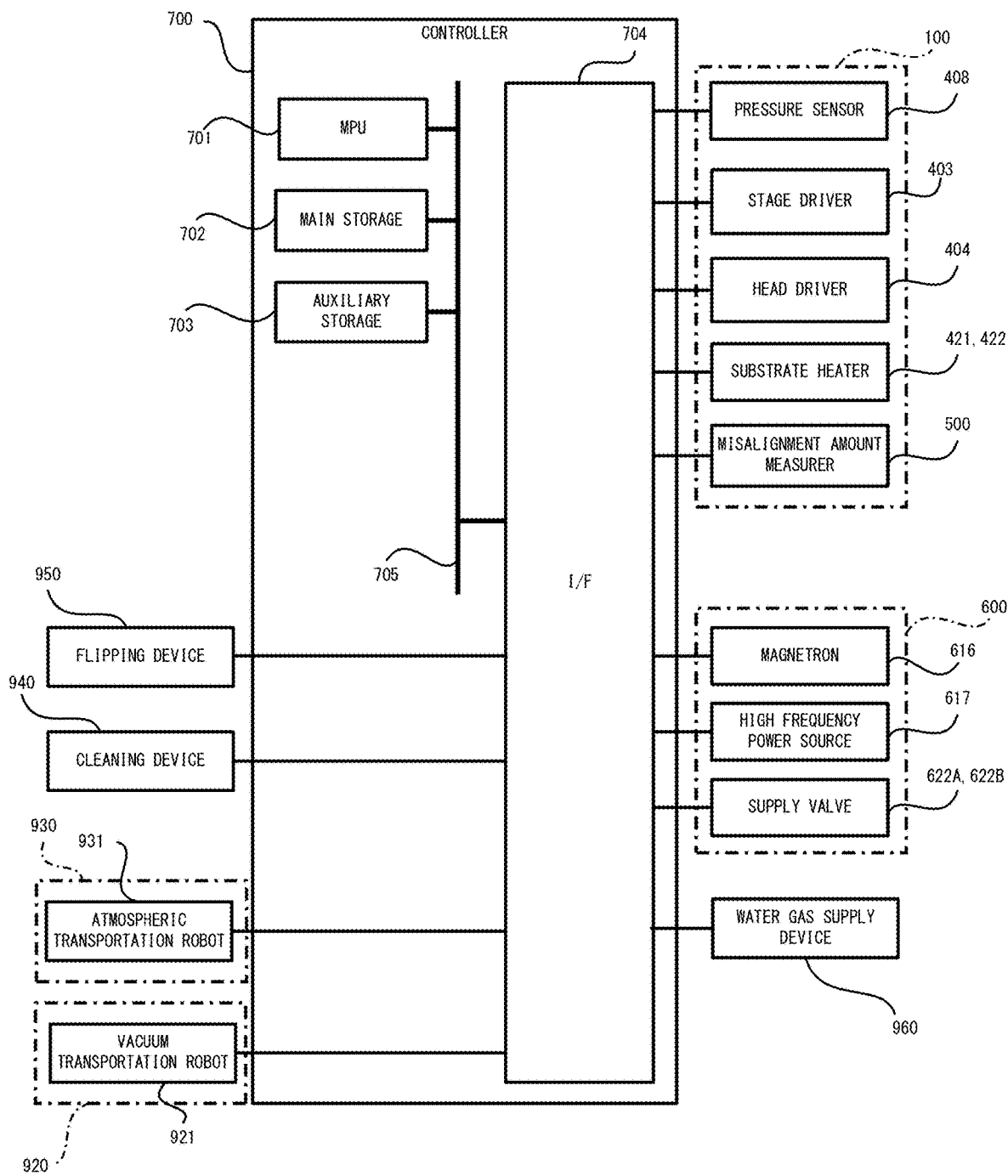
FIG. 4 is a block diagram that shows the configuration of the controller according to the embodiment.

The controller 700 has, as shown in FIG. 4, a micro processing unit (MPU) 701, a main storage 702, an auxiliary storage 703, an interface 704, and a bus 705 that connects the parts. The main storage 702 comprises a volatile memory and is used as the work area of the MPU 701. The auxiliary storage 703 comprises a nonvolatile memory and stores programs that are executed by the MPU 701. The interface 704 converts measurement signals that are entered from the pressure sensor 408, the misalignment amount measurer 500, and the like to measurement information and outputs the measurement information to the bus 705. Moreover, the MPU 701 reads into the main storage 702 and executes the programs that are stored in the auxiliary storage 703, thereby outputting control signals to the stage driver 403, the head driver 404, the substrate heaters 421 and 422, the magnetron 616, the high frequency power source 617, the supply valves 622A and 622B, the vacuum transportation robot 921, the atmospheric transportation robot 931, the water gas supplier 960, and the like via the interface 704.

Here, in regard to the entire substrate joining system according to this embodiment, the operation flow from introduction of the substrates 301 and 302 into the substrate joining system to retrieval of the joined substrates 301 and 302 from the substrate joining system will be described. The substrates 301 and 302 are, first, placed at the introduction port 961. The substrates 301 and 302 are, for example, any of glass substrates, oxide substrates (for example, silicon oxide ($SiO_2$) substrates or alumina substrates ($Al_2O_3$)), and nitride substrates (for example, silicon nitride (SiN), aluminum nitride (AlN)).

Next, the substrates 301 and 302 are transported from the introduction port 961 to the cleaning device 940 by the atmospheric transportation robot 931 of the first transportation device 930 and in the cleaning device 940, cleaned to remove foreign substances that are present on the substrates 301 and 302. Subsequently, the substrates 301 and 302 are transported from the cleaning device 940 to the contour alignment device 800 by the atmospheric transportation robot 931 and in the contour alignment device 800, subject to alignment in their contour and measurement of the substrate thickness. Subsequently, the substrates 301 and 302 are transported to the load lock chamber 910 that is open to the atmosphere by the atmospheric transportation robot 931. Then, the gas that is present within the load lock chamber 910 is discharged to make equal the degree of vacuum within the load lock chamber 910 and the degree of vacuum within the second transportation device 920, and then the substrates 301 and 302 are transported to the hydrophilic treatment device 600 by the vacuum transportation robot 921 of the second transportation device 920.

Subsequently, the substrates 301 and 302 are transported to the hydrophilic treatment device 600, where the hydrophilic treatment is performed on the joint surface of each of the substrates 301 and 302. The hydrophilically-treated substrates 301 and 302 are transported into the load lock chamber 910 again by the vacuum transportation robot 921. Then, water gas is supplied from the water gas supplier 960 to the load lock chamber 910 and the joint surfaces of the substrates 301 and 302 are exposed to the water gas. As a result, a much larger amount of OH groups are produced on the joint surfaces of the substrates 301 and 302. Next, the substrate 301 is transported to the substrate joining device 100 by the vacuum transportation robot 921. On the other hand, the substrate 302 is transported to the flipping device 950 by the vacuum transportation robot 921 and in the flipping device 950, flipped over. Subsequently, the substrate 302 is transported to the substrate joining device 100 by the vacuum transportation robot 921.

Subsequently, the substrates 301 and 302 are joined to each other in the substrate joining device 100. The joined substrates 301 and 302 are transported to the load lock chamber 910 again by the vacuum transportation robot 921. Subsequently, as the load lock chamber, 910 is opened to the atmosphere, the substrates 301 and 302 that are joined to each other are transported from the load lock chamber 910 to the retrieval port 962 by the atmospheric transportation robot 931. The operation flow of the entire substrate joining system, according to this embodiment is described above.

Figure 5:
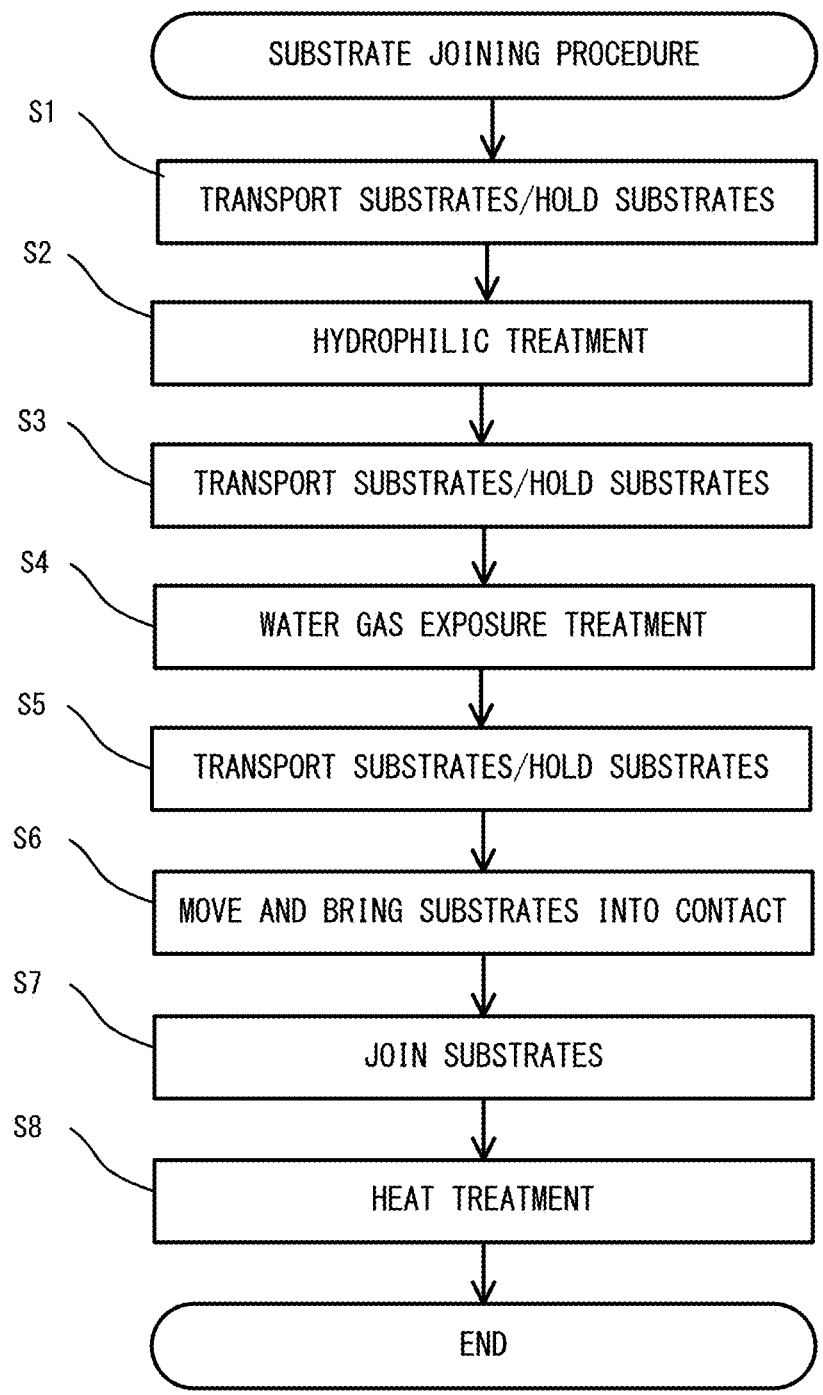
FIG. 5 is a flowchart that shows the process flow of the substrate joining procedure that is executed by the substrate joining system according to the embodiment.

Next, the substrate joining procedure that is executed by the substrate joining system (the controller 700) according to this embodiment, will be described with reference to FIG. 5. Triggered by the controller 700 activating the program for executing the substrate joining procedure, this substrate joining procedure starts. Here, FIG. 5 shows the process flow up to the substrates 301 and 302 being joined to each other after transported to the load lock chamber 910.

First, the controller 700 controls the vacuum transportation robot 921 of the second transportation device 920 to transport the substrate 301 (302) to the hydrophilic treatment device 600 and in the hydrophilic treatment device 600, the transported substrate 301 (302) is held on the stage 610 (Step S1).

Next, the controller 700 controls the hydrophilic treatment device 600 to execute the hydrophilic treatment to hydrophilize the joint surface of the substrate 301 (302)(the hydrophilic treatment step)(Step S2). The hydrophilic treatment will be described in detail later. As a result, OH groups are produced on the joint surface of the substrate 301 (302).

Subsequently, the controller 700 controls the vacuum transportation robot 921 to transport the substrate 301 (302) from the hydrophilic treatment device 600 to the load lock chamber 910 and in the load lock chamber 910, the transported substrate 301 (302) is held on the stage (Step S3).

Subsequently, the controller 700 controls the water gas supplier 960 to introduce water gas into the load lock chamber 910 from the water gas generation device to expose the substrate 301 (302) to the water gas ($H_2O$), thereby performing a water gas exposure treatment to supply water to the joint surfaces of the substrates 301 and 302 (the first water supply step) (Step S4). As a result, moisture, which was short during the plasma treatment, is replenished and OH groups are additionally produced on the joint surface of the substrate 301 (302).

Next, the controller 700 controls the vacuum transportation robot 921 to transport the substrate 301 (302) from the load lock chamber 910 to the substrate joining device 100 and in the substrate joining device 100, the transported substrate 301 (302) is held on the stage 401 (the head 402)(Step S5). Here, for the substrate 302 that is to be held on the head 402 of the substrate joining device 100, the controller 700 first transports the substrate 302 from the load lock chamber 910 to the flipping device 950 and controls the flipping device 950 to flip over the substrate 302. Subsequently, the controller 700 controls the vacuum transportation robot 921 to transport the substrate 302 that is flipped over by the flipping device 950 to the substrate joining device 100. As a result, the substrate 301 is held on the stage 401, and the substrate 302 is held on the head 402.

Subsequently, the controller 700 controls the substrate joining device 100 to move the substrate 302 in the direction of the substrates 301 and 302 mutually approaching from a mutually distant state of the substrates 301 and 302 so as to bring the joint surfaces of the substrates 301 and 302 into mutual contact (Step S6). Here, the substrate joining device 100 first moves the head 402 that supports the substrate 302 toward the stage 401 that supports the substrate 301 so that both substrates 301 and 302 get closer to each other. Next, with both substrates 301 and 302 being closer to each other, the substrate joining device 100 executes the alinement operation of both substrates 301 and 302 based on the amount of misalignment that is measured by the misalignment amount measurer 500. Subsequently, the substrate joining device 100 moves the head 402 toward the stage 401 again to bring the two substrates 301 and 302 into contact.

Subsequently, the controller 700 controls the substrate joining device 100 to execute the joining process to join the substrates 301 and 302 in a vacuum (the joining step)(Step S7). Here, the substrate joining device 100 pressurizes the two substrates 301 and 302 of which the joint surfaces are in mutual contact to join the two substrates 301 and 302. At this point. the joint surfaces of the substrates 301 and 302 are each covered with OH groups or water molecules. As a result, with the joint surfaces of the substrates 301 and 302 being brought into mutual contact, the substrates 301 and 302 are temporarily joined together by the hydrogen bond between OH groups or water molecules.

Next, the controller 700 executes a heat treatment to heat the substrates 301 and 302 that are temporarily joined to each other (Step S8). Here, the substrate joining device 100 keeps the substrates 301 and 302 heated, for example, to 120 to 200° C. for two to seven hours by means of the substrate heaters 421 and 422. As a result, presumably, the majority of the water molecules and hydrogen that are produced while the OH groups that are present on the joint surfaces of the substrates 301 and 302 make the transition from the hydrogen bond to the covalent bond or the water molecules and hydrogen that remain on the joint surfaces of the substrates 301 and 302 in a vacuum escape outside the joint interface of the substrates 301 and 302 and a solid covalent bond is formed between the joint surfaces. At this point, presumably, in the course of the water molecules and hydrogen escaping from the joint interface of the temporarily-joined substrates 301 and 302, the joint surfaces of the substrates 301 and 302 come into mutual contact even in parts where no contact was made during the temporary joining, whereby the joint interface is substantially extended, and the joint area is increased.

Figure 6:
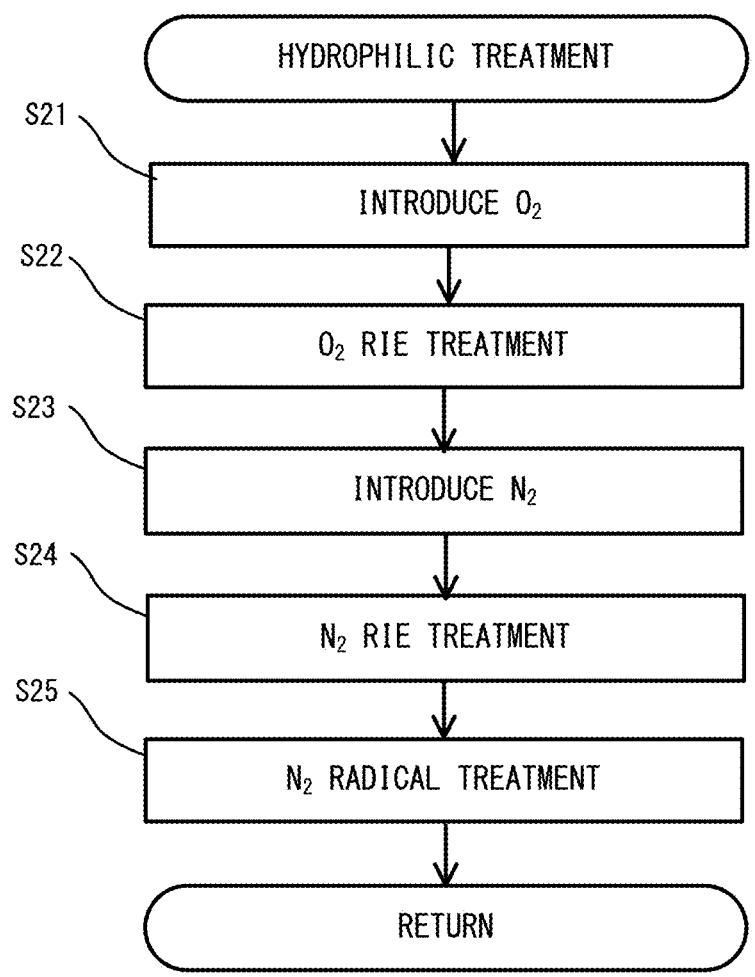
FIG. 6 is a flowchart that shows the process flow of the hydrophilic treatment that is executed by the substrate joining system according to the embodiment.

Here, the above-mentioned hydrophilic treatment that is executed by the hydrophilic treatment device 600 will be described in detail with reference to FIG. 6. First, the controller 700 controls the $O_2$ gas supplier 620B to introduce $O_2$ gas into the chamber 612 (Step S21). Specifically, the controller 700 opens the supply valve 622B so as to introduce $O_2$ gas into the chamber 612 from the $O_2$ gas reservoir 621B through the supply pipe 623B.

Next, with supply of microwaves to the chamber 612 from the magnetron 616 being stopped, the contoller 700 controls the high frequency power source 617 to apply a high frequency bias to the substrates 301 and 302 that are held on the stage 610. As a result, an $O_2$ reactive ion etching (RIE) treatment to perform RIE using $O_2$ gas is performed on the joint surfaces of the substrates 301 and 302 (the second etching step) (Step S22).

Subsequently, the controller 700 closes the supply valve 622B to stop supply of $O_2$ gas into the chamber 612 from the $O_2$ gas reservoir 621B, thereby discharging $O_2$ gas within the chamber 612. Subsequently, the controller 700 controls the $N_2$ gas supplier 620A to introduce $N_2$ gas into the chamber 612 (Step S23). Specifically, the controller 700 opens the supply valve 622A to introduce $N_2$ gas into the chamber 612 from the $N_2$ gas reservoir 621A through the supply pipe 623A.

Subsequently, with supply of microwaves to the chamber 612 from the magnetron 616 being still stopped, the controller 700 controls the high frequency power source 617 to apply a high frequency bias to the substrates 301 and 302. As a result, a $N_2$ reactive ion etching (RIE) treatment to perform RIE using $N_2$ gas is performed on the joint surface of each of the substrates 301 and 302 (the first etching step) (Step S24).

Next, the controller 700 controls the magnetron 616 to start supply of microwaves to the chamber 612 from the magnetron 616 to generate plasma with $N_2$ gas. At this point, the controller 700 controls the high frequency power source 617 to stop application of a high frequency bias to the substrates 301 and 302 by the high frequency power source 617. In this way, a $N_2$ radical treatment to irradiate the joint surfaces of the substrates 301 and 302 with $N_2$ radicals (the radical treatment step) is performed (Step S25). Subsequently, the above-described processing of the Step S3 in FIG. 5 is executed.

Here, in the hydrophilic treatment, according to this embodiment, the above-described processing of the Steps S21 and S22 may be omitted. In other words, in the hydrophilic treatment. only the processing of the Steps S23 to S25 may be performed.

Next, results of assessment of the joint strength of the two substrates 301 and 302 that are joined by the substrate joining system according to this embodiment will be described. Here, results of assessment of the joint strength of the two substrates 301 and 302 that are joined by the substrate joining method according to this embodiment and results of assessment of the joint strength of two substrates that are joined by the substrate joining methods according to Comparative Embodiments 1 to 8 that are described later are described. First, the substrate joining methods according to Comparative Embodiments 1 to 8 will be described.

Figure 7A:
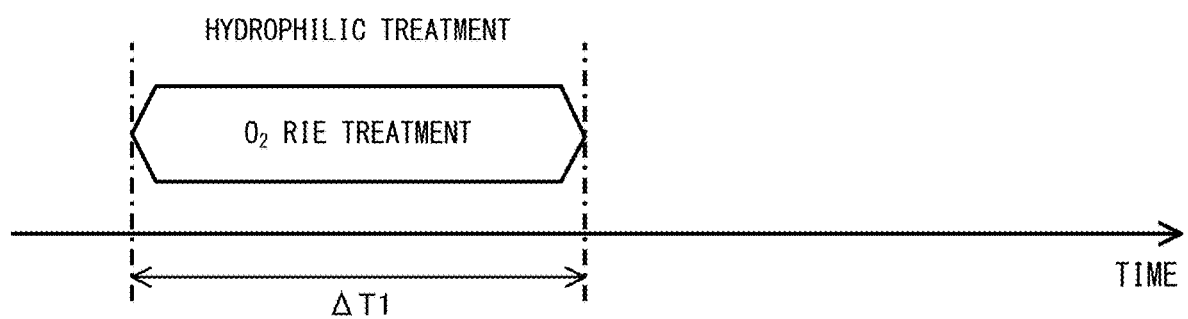
FIG. 7A is a time chart for explaining the substrate joining method according to Comparative Embodiments 1 to 4.
Figure 7B:
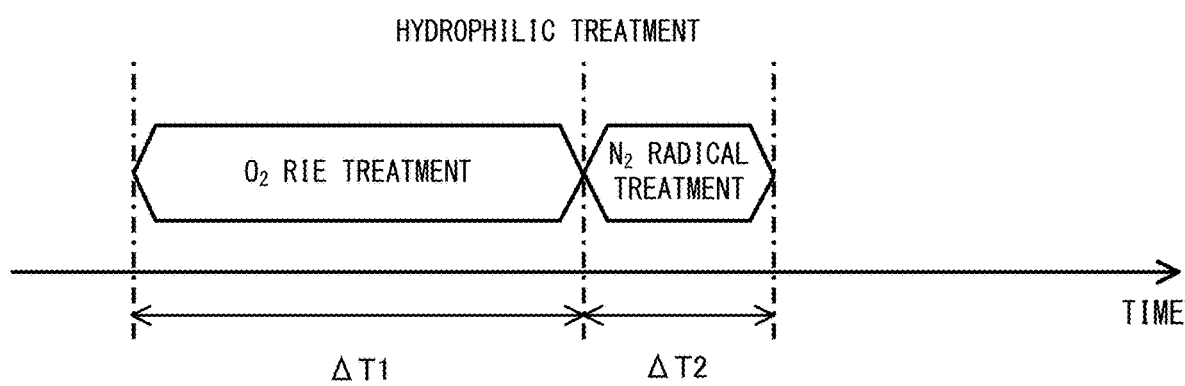
FIG. 7B is a time chart for explaining the substrate joining method according to Comparative Embodiments 5 to 7.
Figure 7C:
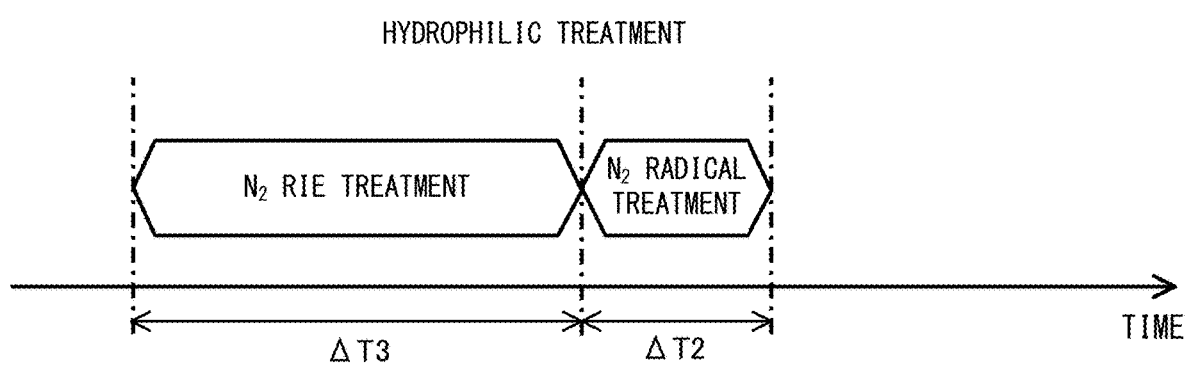
FIG. 7C is a time chart for explaining the substrate joining method according to the embodiment.
Figure 7D:
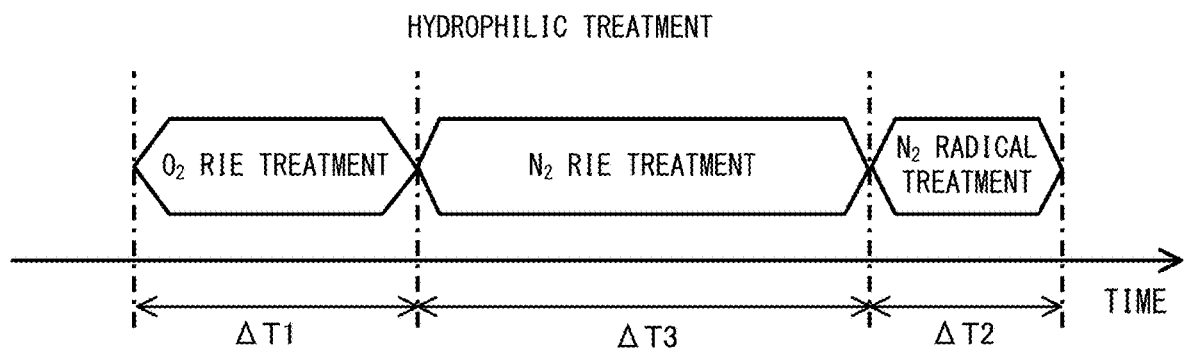
FIG. 7D is a time chart for explaining the substrate joining method according to the embodiment.
Figure 7E:
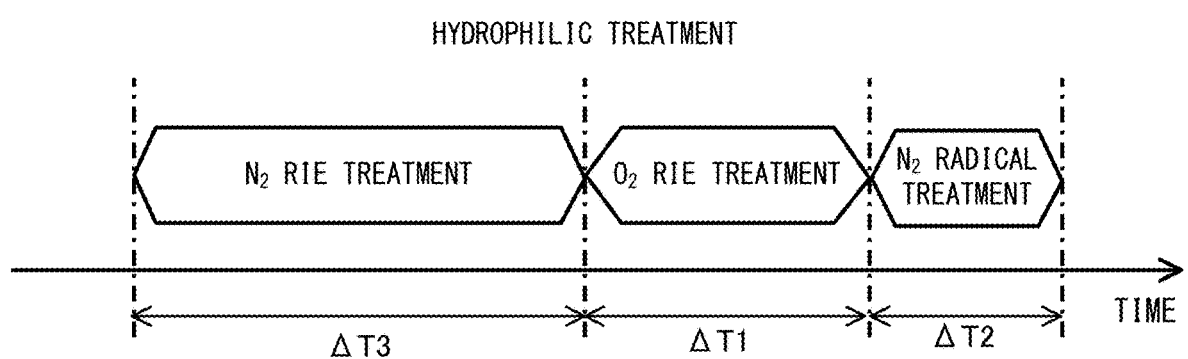
FIG. 7E is a time chart for explaining the substrate joining method according to Comparative Embodiment 8.

In the substrate joining method, according to Comparative Embodiments 1 to 4, as shown in FIG. 7A, only the $O_2$ RIE treatment is executed on the joint surfaces of the substrates 301 and 302 in the hydrophilic treatment. Moreover, in the substrate joining method according to Comparative Embodiments 5 to 7, as shown in FIG. 7B, the $O_2$ RIE treatment is executed, and then the $N_2$ radical treatment is executed in the hydrophilic treatment. On the other hand, in the first substrate joining method according to this embodiment (which is hereafter referred to as "the first substrate joining method"), as shown in FIG. 7C, the $N_2$ RIE treatment is executed, and then the $N_2$ radical treatment is executed in the hydrophilic treatment. Moreover, in the second substrate joining method according to this embodiment (which is hereafter referred to as "the second substrate joining method"), as shown in FIG. 7D, the $O_2$ RIE treatment is executed, then the $N_2$ RIE treatment is executed, and subsequently, the $N_2$ radical treatment is executed in the hydrophilic treatment. Furthermore, in the substrate joining method according to Comparative Embodiment 8. as shown in FIG. 7E, the $N_2$ RIE treatment is executed, then the $O_2$ RIE treatment is executed, and subsequently, the $N_2$ radical treatment is executed in the hydrophilic treatment.

Next, results of assessment of the joint strength of the two substrates 301 and 302 that were joined to each other by the substrate joining methods according to Comparative Embodiments 1 to 8 and by the first substrate joining method and the second substrate joining method according to this embodiment will be described. Here, the explanation is made with regard to a case in which glass substrates were employed as the substrates 301 and 302. The joint strength was assessed on 12 different Samples 1 to 12 that were obtained by employing different substrate joining methods and using different combinations of treatment times ΔT1, ΔT2, and ΔT3 of the $O_2$ RIE treatment, the $N_2$ RIE treatment, and the $N_2$ radical treatment. Here, as the hydrophilic treatment device 600 to use for the $O_2$ RIE treatment, the $N_2$ RIE treatment, and the $N_2$ radical treatment of the substrates 301 and 302, a configuration comprising, in the configuration shown in FIG. 2, plate electrodes that are provided on the glass window 613 and a high frequency power source that is electrically connected to the plate electrodes in place of the magnetron 616 and the waveguide 615 was used. Moreover, the bias power of a high frequency bias that is applied to the substrates 301 and 302 during the $O_2$ RIE treatment and the $N_2$ RIE treatment was set to 250 W in all cases. Moreover, the power that is supplied to the chamber 612 from the magnetron 616 during the $N_2$ radical treatment was set to 250 W in all cases. Moreover, the degree of vacuum within the chamber 200 of the substrate joining device 100 was set to $5.0 \times 10^{-3}$ Pa for all samples. Moreover, for joining the substrates 301 and 302, the substrates 301 and 302 were kept under a pressure of 10N for one minute in all sample cases. Furthermore, the heat treatment was conducted at a treatment temperature of 200° C. for a treatment time of two hours. Table 1 below collectively shows, for each of the 12 different Samples 1 to 12, the substrate joining method employed and the treatment times of the $O_2$ RIE treatment, the $N_2$ RIE treatment, and the $N_2$ radical treatment in the hydrophilic treatment of the substrate joining method. Here, in the column "treatment time" in Table 1, "$O_2$ RIE" presents the treatment time ΔT1 of the $O_2$ RIE treatment, "$N_2$ RIE" presents the treatment time ΔT3 of the $N_2$ RIE treatment, and "$N_2$ radical" presents the treatment time ΔT2 of the $N_2$ radical treatment. Moreover, in the column "substrate joining method," "Comparative Embodiment 1 (2 to 8)" indicates that the above-described substrate joining method according to Comparative Embodiment 1 (2 to 8) was employed, and "the first substrate joining method" indicates that the above-described first substrate joining method according to the embodiment was employed. Moreover, "the second substrate joining method" indicates that the above-described second substrate joining method, according to the embodiment was employed.

TABLE 1

| | treatment time (sec) | | | |
|---|---|---|---|---|
| | O₂ RIE | N₂ RIE | N₂ radical | substrate joining method |
| Sample 1 | 30 | — | — | Comparative Embodiment 1 |
| Sample 2 | 60 | — | — | Comparative Embodiment 2 |
| Sample 3 | 120 | — | — | Comparative Embodiment 3 |
| Sample 4 | 180 | — | — | Comparative Embodiment 4 |
| Sample 5 | 120 | — | 7.5 | Comparative Embodiment 5 |
| Sample 6 | 120 | — | 15 | Comparative Embodiment 6 |
| Sample 7 | 120 | — | 30 | Comparative Embodiment 7 |
| Sample 8 | — | 120 | 15 | First substrate joining method |
| Sample 9 | — | 60 | 15 | First substrate joining method |
| Sample 10 | 30 | 90 | 15 | Second substrate joining method |
| Sample 11 | 60 | 60 | 15 | Second substrate joining method |
| Sample 12 | 60 | 60 | 15 | Comparative Embodiment 8 |

Figure 8A:
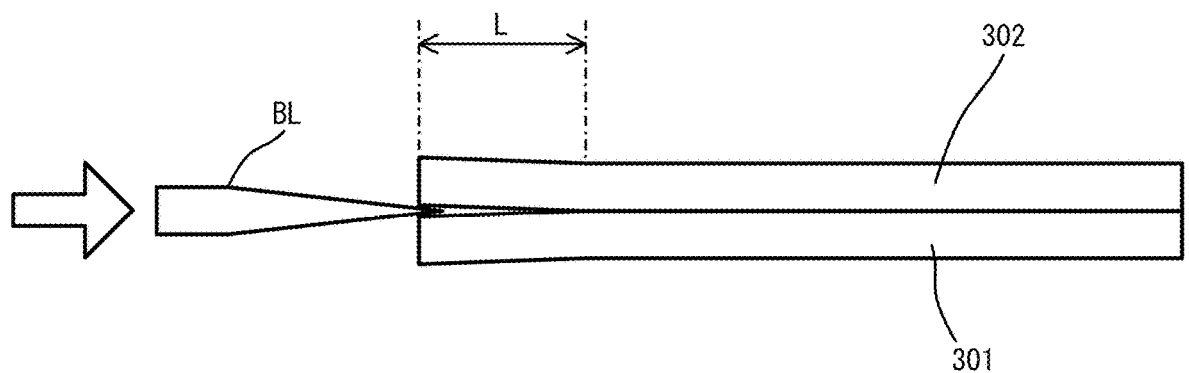
FIG. 8A is an illustration for explaining the method of measuring the joint strength (calculated in the surface energy) of the substrates by the blade insertion method.
Figure 8B:
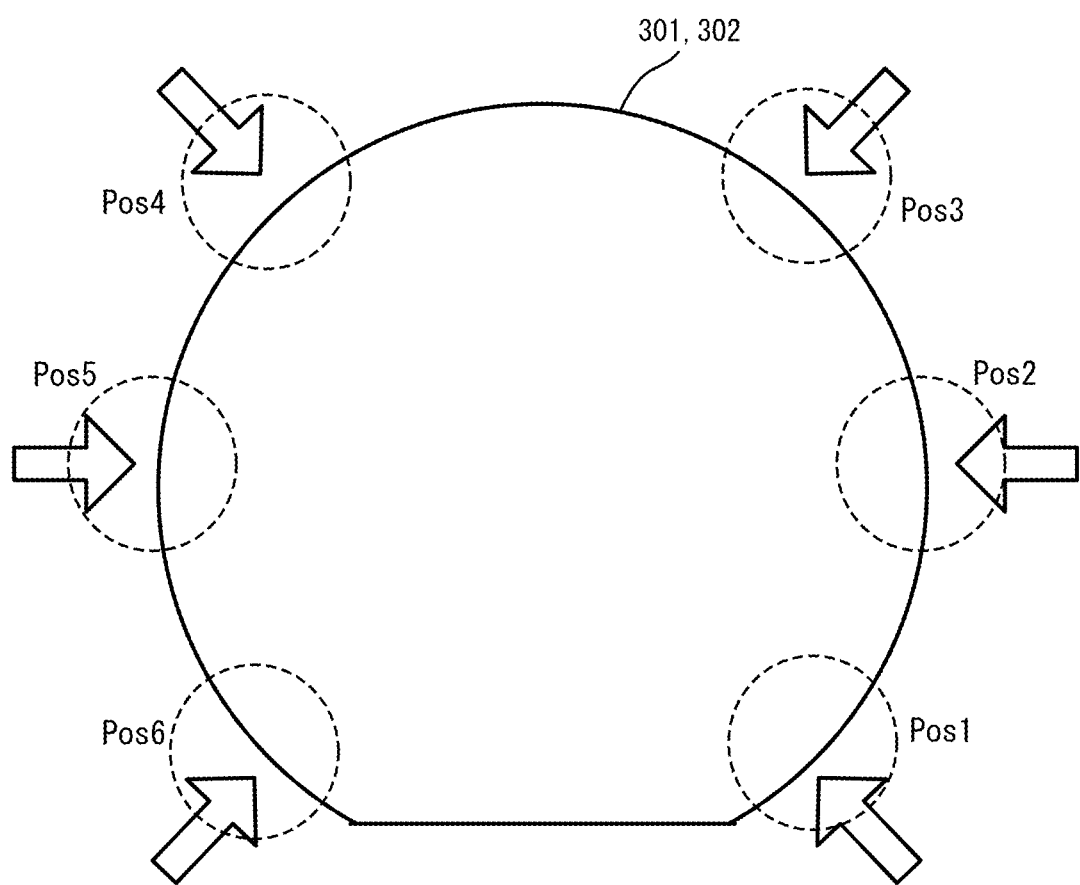
FIG. 8B is an illustration for explaining the method of assessing the joint strength according to the embodiment.
Figure 9A:
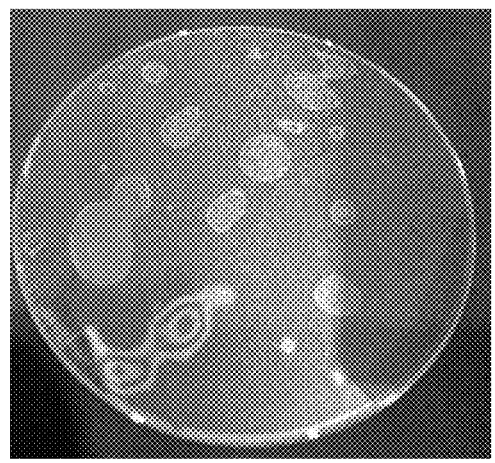
FIG. 9A is a photograph of the appearance of Sample 1.
Figure 9B:
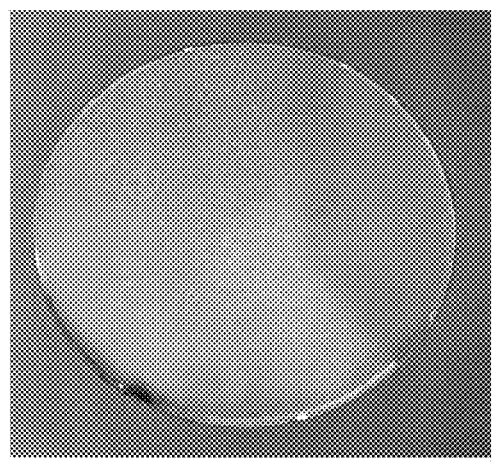
FIG. 9B is a photograph of the appearance of Sample 2.
Figure 9C:
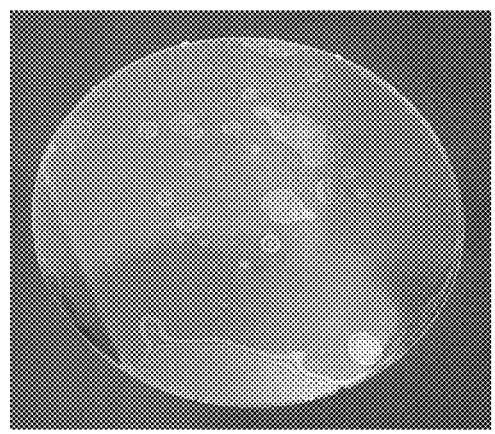
FIG. 9C is a photograph of the appearance of Sample 3.
Figure 9D:
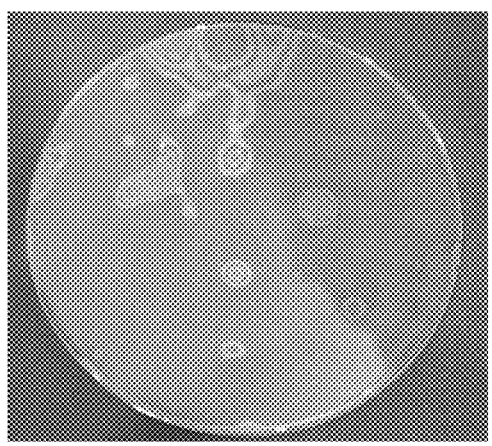
FIG. 9D is a photograph of the appearance of Sample 4.

Moreover, the joint strength of the substrates 301 and 302 of Samples 1 to 12 was assessed by measuring the joint strength (calculated in the surface energy) using the crack and opening method in which a blade is inserted. In the crack and opening method, first, as indicated by the arrow in FIG. 8A, the detachment length L between the substrates 301 and 302 when a blade BL such as a razor blade is inserted into a joint part from the rims of the two substrates 301 and 302 that were joined to each other is measured. As the blade BL, for example, a blade of 100 μm in thickness is used. Moreover, as shown in FIG. 8B, the detachment length L from the blade contact point when the blade BL was inserted at six points (Pos1, Pos2, Pos3, Pos3, Pos4, Pos5, Pos6) on the rims of the two substrates 301 and 302 that were joined to each other (see the arrows in FIG. 8B) was measured. Then, the joint strength of the substrates 301 and 302 was assessed by obtaining the strength of the joint interface of the substrates 301 and 302 that is calculated in the surface energy per unit area from the detachment length L at each of the six points on the rims of the substrates 301 and 302. Here, the relational expression (1) below was used to calculate the joint strength (calculated in the surface energy) Eb from the detachment length L.

[Math 1]

$$Eb = \frac{3 \times Y \times T_S^3 \times Tb^2}{32 \times L^4} \quad \text{Expression (1)}$$

in which Y is the Young's modulus, Ts is the thickness of the substrates 301 and 302, and Tb is the thickness of the blade BL. In assessment of the joint strength of the substrates 301 and 302 of Samples 1 to 12, the Young's modulus Y was $6.5 \times 10^{10}$ [N/m²], the thickness Ts of the substrates 301 and 302 was 0.0011 m (1.1 mm), and the thickness Tb of the blade BL was 0.0001 in (0.1 mm). From the calculation formula, the shorter the detachment length is, the higher the joint strength is. Table 2 shows the average values of the joint strengths (calculated in the surface energy) at the six points on the rims of the substrates 301 and 302. Here, higher calculated joint strengths (calculated in the surface energy) indicate higher joint strengths of the substrates 301 and 302. Those that were subjected to "bulk destruction" are indicated by"bulk destruction." Generally, bulk destruction beyond 2 J/m² is preferable. Moreover, among those that were subjected to bulk destruction, presumably, the shorter the detachment length was, the higher the joint strength was. Therefore, the detachment lengths are listed as well.

Results of assessment of the joint strength of the substrates 301 and 302 of Samples 1 to 12 are shown in Table 2 below and FIGS. 9A to 11D. Here, in Table 2, the column "Sample name" corresponds to each of Samples 1 to 12 in the above-described Table 1. The values in the column "detachment length" present the average values of detachment lengths at the six points ("Pos1" to "Pos6") on the rims of the two substrates 301 and 302 shown in FIG. 8B. Moreover, the values in the column "joint strength (calculated in the surface energy)" present the average values of joint strengths (calculated in the surface energy) at the six points ("Pos1" to "Pos6") on the rims of the two substrates 301 and 302 shown in FIG. 8B. Furthermore, in the column "presence/absence of bulk destruction," "absence" indicates that no bulk destruction occurred and the numeric values indicate the number of points where bulk destruction occurred among the six points ("Pos1" to "Pos6") on the rims of the two substrates 301 and 302. FIGS. 9A to 11D are photographs that show the appearance of each of Samples 1 to 12.

TABLE 2

| Sample name | detachment length (mm) | joint strength (calculated in surface energy (J/m²)) | presence/absence of bulk destruction |
|---|---|---|---|
| Sample 1 | 20.3 | 0.48 | absence |
| Sample 2 | 19.3 | 0.59 | absence |
| Sample 3 | 18.5 | 0.69 | absence |
| Sample 4 | 18.8 | 0.66 | absence |
| Sample 5 | 17.3 | 0.90 | absence |
| Sample 6 | 12.6 | bulk destruction | 2 |
| Sample 7 | 15.9 | 1.26 | absence |
| Sample 8 | 6.2 | bulk destruction | 6 |
| Sample 9 | 12.3 | bulk destruction | 3 |
| Sample 10 | 7.0 | bulk destruction | 5 |
| Sample 11 | 5.1 | bulk destruction | 6 |
| Sample 12 | 14.3 | 1.9 | absence |

Of Samples 1 to 4 for which the conditions were set in the method that employed the substrate joining method according to Comparative Embodiments 1 to 4 (only the O₂ RIE treatment is performed in the hydrophilic treatment), the joint strength (calculated in the surface energy) was 0.48 to 0.69 J/m² and any of Samples 1 to 4 reached the bulk destruction strength at none of the points. Moreover, as shown in FIGS. 9A to 9D, almost no part where the joint surfaces of the substrates 301 and 302 were not joined together was observed in Sample 2 while some parts where the joint surfaces of the substrates 301 and 302 were not joined were observed in Samples 1, 3, and 4. Consequently, the wettability between the substrates 301 and 302 is the best when the treatment time of the O₂ RIE treatment was 120 sec and the joint strength was the highest when the treatment time of the O₂ RIE treatment was 60 sec. From these, presumably, the optimum value of the treatment time of the O₂ RIE treatment is a treatment time of the O₂ RIE treatment between 60 sec and 120 sec or so. Consequently, it is understood that with all efforts of setting conditions in the conventional hydrophilic treatment method according to Comparative Embodiments 1 to 4, a sufficient joint strength cannot be obtained in joining the substrates 301 and 302 together in a vacuum.

Figure 10A:
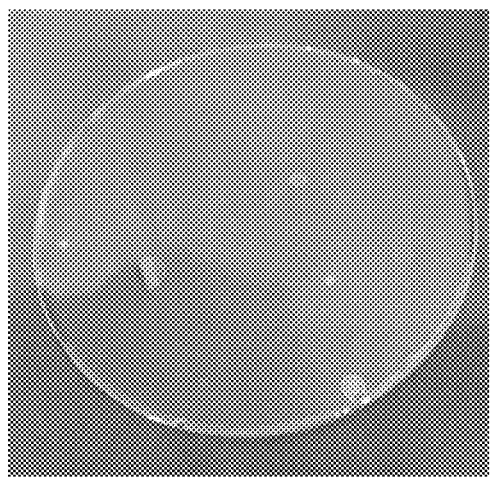
FIG. 10A is a photograph of the appearance of Sample 5.
Figure 10B:
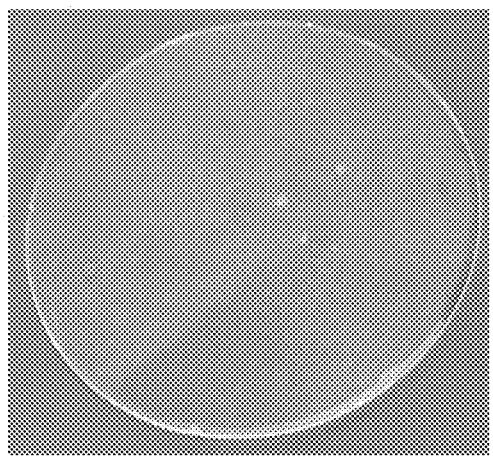
FIG. 10B is a photograph of the appearance of Sample 6.
Figure 10C:
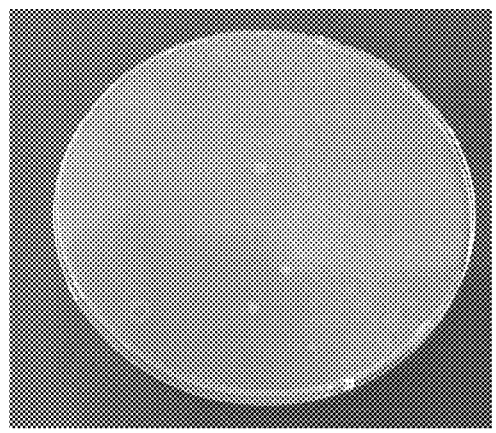
FIG. 10C is a photograph of the appearance of Sample 7.

Moreover, the joint strength (calculated in the surface energy) of Samples 5 and 7 that were obtained by employing the above 120 sec as the treatment time of the O₂ RIE treatment and varying the treatment time of the N₂ radical treatment in the method that employed the substrate joining method according to Comparative Embodiments 5 to 7 (the $O_2$ RIE treatment and the $N_2$ radical treatment are performed in the hydrophilic treatment) was 0.90 to 1.26 J/m². Moreover, Sample 6 reached the bulk destruction strength at two points on the rims of the two substrates 301 and 302. As just stated, the joint strength of the substrates 301 and 302 was improved when the substrate joining method according to Comparative Embodiments 5 to 7 was employed compared with when the substrate joining method according to Comparative Embodiments 1 to 4 was employed. Moreover, presumably, the optimum value of the treatment time of the $N_2$ radical treatment is around 15 sec. Moreover, as shown in FIGS. 10A to 10C, almost no part where the substrates 301 and 302 were not joined was observed in Samples 5 to 7. In regard to these results, in the substrate joining method according to Comparative Embodiments 5 to 7, presumably, performing the $N_2$ radical treatment in addition to the $O_2$ RIE treatment in the hydrophilic treatment resulted in increasing the amount of OH groups that are present on the joint surfaces of the substrates 301 and 302 and thus increasing the joint strength of the substrates 301 and 302. From these results, in the hydrophilic treatment method according to Comparative Embodiments 5 to 7, presumably, the optimum value of the treatment time of the $N_2$ radical treatment is around 15 sec.

Figure 10D:
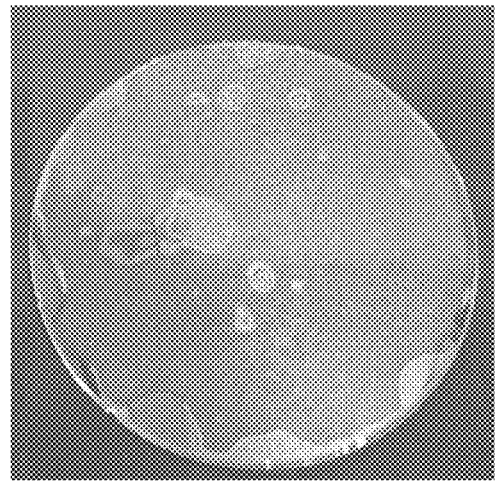
FIG. 10D is a photograph of the appearance of Sample 8.
Figure 11A:
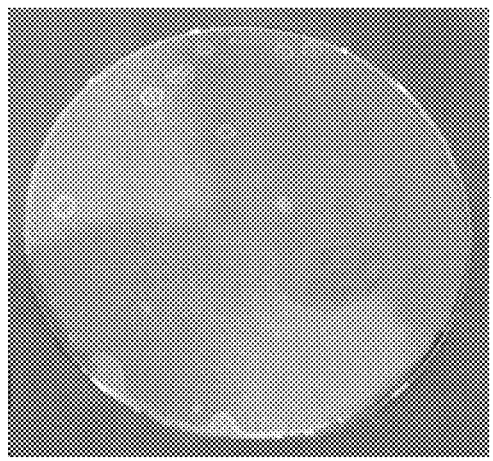
FIG. 11A is a photograph of the appearance of Sample 9.

Sample 8 that was obtained by setting conditions in the method that employed the first substrate Joining method according to this embodiment reached the bulk destruction strength at all six points on the rims of the two substrates 301 and 302 and the detachment length L was 6.2 mm. Moreover, Sample 9 also reached the bulk destruction strength at three points on the rims of the two substrates 301 and 302 and the detachment length L was 12.3 mm. As just stated, the joint strength of the substrates 301 and 302 was further improved when the first substrate joining method according to this embodiment was employed compared with when the substrate joining method according to Comparative Embodiments 5 to 7 was employed. Moreover, as shown in FIGS. 10D and 11A, defective mutual joint parts of the substrates 301 and 302 occurred in Sample 8 while only voids due to particles occurred at several points in Sample 9. From these results, in the hydrophilic treatment method according to the first substrate joining method in which the processing is executed in the order of the $N_2$ RIE treatment→$N_2$ radical treatment, presumably, the optimum value of the treatment time of the $N_2$ RIE treatment is around 120 sec. In regard to this result, in the first substrate joining method according to this embodiment, presumably, performing the $N_2$ RIE treatment in place of the $O_2$ RIE treatment in the hydrophilic treatment resulted in further increasing the amount of OH groups that are present on the joint surfaces of the substrates 301 and 302 and thus further increasing the joint strength of the substrates 301 and 302.

Figure 11B:
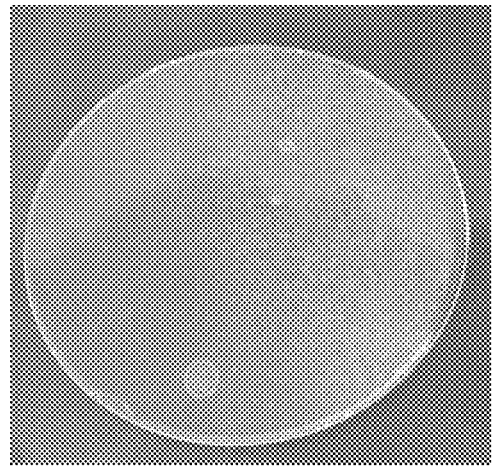
FIG. 11B is a photograph of the appearance of Sample 10.
Figure 11C:
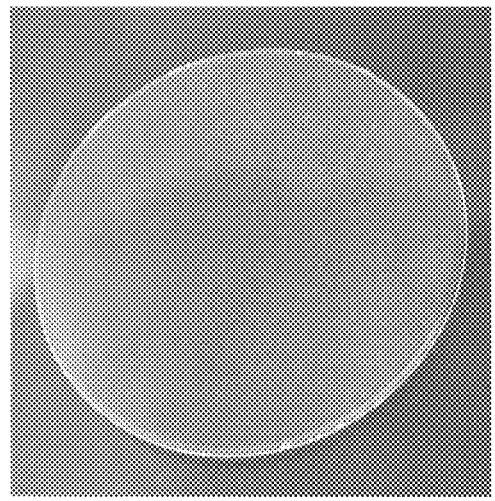
FIG. 11C is a photograph of the appearance of Sample 11.
Figure 11D:
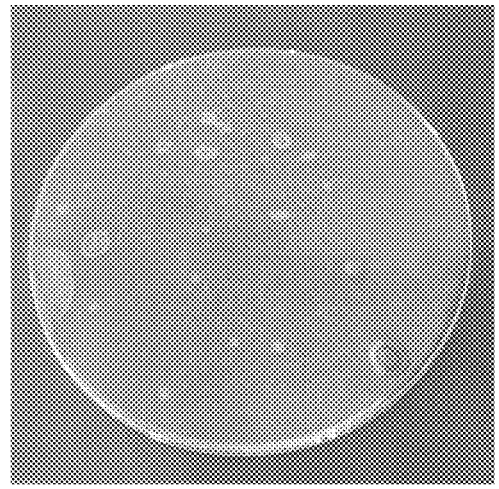
FIG. 11D is a photograph of the appearance of Sample 12.

Furthermore, Sample 10 that was obtained by setting conditions in the method that employed the second substrate joining method according to this embodiment reached the bulk destruction strength at five points on the rims of the two substrates 301 and 302 and the detachment length L was 7.0 mm. Moreover, Sample 11 reached the bulk destruction strength at all six points on the rims of the two substrates 301 and 302 and the detachment length L was 5.1 mm. As just stated, given that the treatment time of the $N_2$ RIE treatment was equal, the joint strength of the substrates 301 and 302 was further improved when the second substrate joining method according to this embodiment was employed compared with when the first substrate joining method was employed. Moreover, as shown in FIGS. 11B and 11C, except for parts due to voids, almost no part where the joint surfaces of the substrates 301 and 302 were not joined together was observed in Samples 10 and 11. Particularly, as shown in FIG. 11C, Sample 11 had no void and a high joint strength, whereby presumably, nearly the optimum conditions were set. In regard to these results, in the second substrate joining method according to this embodiment, presumably, performing the $O_2$ RIE treatment before the $N_2$ RIE treatment in the hydrophilic treatment resulted in further increasing the joint strength of the substrates 301 and 302 and increasing the wettability between the substrates 301 and 302 as well.

On the other hand, Sample 12 reached the bulk destruction strength at none of the six points on the rims of the substrates 301 and 302. In other words, with the order of the $N_2$ RIE treatment and the $O_2$ RIE treatment being reversed from the second substrate joining method, the joint strength was lower than Samples 8 and 6 that were obtained separately by performing only the $N_2$ RIE treatment or only the $O_2$ RIE treatment. Moreover, both the wettability and the joint strength of the substrates 301 and 302 were lower compared with Sample 11. From these results, it is understood that the order of the $O_2$ RIE treatment→the $N_2$ RIE treatment is important in the hydrophilic treatment.

As stated above, it is understood that the joint strength of the substrates 301 and 302 improves when the first substrate joining method or the second substrate joining method according to this embodiment is employed compared with when the substrate joining methods according to Comparative Embodiments 1 to 7 are employed. Moreover, it is also understood that occurrence of parts where the joint surfaces of the substrates 301 and 302 are not joined together is suppressed. Moreover, from the above-described assessment results, it is understood that the $O_2$ RIE treatment serves to improve the mutual wettability of the substrates 301 and 302 and the $N_2$ RIE treatment serves to improve the mutual joint strength of the substrates 301 and 302. In other words, the $N_2$ RIE treatment alone fails to lead to a sufficient mutual wettability of the substrates 301 and 302 while the $O_2$ RIE treatment alone fails to lead to a sufficient mutual joint strength of the substrates 301 and 302. Then, in the processing in the order of the $O_2$ RIE treatment→the $N_2$ RIE treatment→the $N_2$ radical treatment, as the $N_2$ RIE treatment is performed after removing contaminants such as organic substances that are present on the joint surfaces of the substrates 301 and 302 in the $O_2$ RIE treatment, presumably, the effect of improving the mutual joint strength of the substrates 301 and 302 in the $N_2$ RIE treatment is obtained along with improvement in the mutual wettability of the substrates 301 and 302. Then, presumably, the order of the $N_2$ RIE treatment→the $O_2$ RIE treatment does not yield these effects.

As described above, in the substrate joining system according to this embodiment, the $N_2$ RIE treatment is performed on the joint surface of each of the two substrates 301 and 302 and then the $N_2$ radical treatment is performed on the joint surface of each of the two substrates 301 and 302 in the hydrophilic treatment. Specifically, the controller 700 of the substrate joining system controls the $N_2$ gas supplier 620A to supply $N_2$ gas into the chamber 612. Then, the controller 700 controls the high frequency power source 617 to apply a high frequency bias to the substrates 301 and 302 to perform the $N_2$ RIE treatment on the joint surfaces of the substrates 301 and 302. Subsequently, the controller 700 controls the magnetron 616 and the high frequency power source 617 to generate plasma with $N_2$ gas while stopping application of the high frequency bias to the substrates 301 and 302 to perform the $N_2$ radical treatment on the joint surfaces of the substrates 301 and 302. In other words, the $N_2$ RIE treatment serves for N ions to collide against the joint surfaces of the substrates 301 and 302 with a relatively strong collision force to form many sites for OH group to adhere. Then, the subsequent highly reactive $N_2$ radical treatment with a relatively weak collision force of $N_2$ radicals against the joint surfaces of the substrates 301 and 302 serves to form sites for OH groups to adhere while suppressing release of OH groups that have adhered to the sites. As a result, adherence of OH groups to the joint surfaces of the substrates 301 and 302 is efficiently augmented and it is possible to produce a large number of OH groups on the joint surfaces of the substrates 301 and 302. Thus, when the joint surfaces of the substrates 301 and 302 are brought info mutual contact and the substrates 301 and 302 are joined, it is possible to form a large number of hydrogen bonds between the joint surfaces as a large number of OH groups are produced, whereby the hydrogen bond turns into the covalent bond through a subsequent heating step and the joint strength of the substrates 301 and 302 that are joined to each other is improved.

Moreover, the substrate joining system according to this embodiment joins the substrates 301 and 302 in a vacuum. As a result, there is no air that is interposed between the substrates 301 and 302 as in the case of, for example, joining the substrates 301 and 302 in the atmosphere. Thus, air gaps and extra water molecules on the joint interface of the substrates 301 and 302, which are as a result of the substrates 301 and 302 being joined together with air incorporated in parts of the substrates 301 and 302, are blown off and occurrence of microvoids is suppressed.

Furthermore, in the hydrophilic treatment according to this embodiment, the $O_2$ RIE treatment using $O_2$ gas is performed on the joint surface of each of the substrates 301 and 302 before the $N_2$ RIE treatment. Specifically, the controller 700 of the substrate joining system controls the $O_2$ gas supplier 620B to supply $O_2$ gas into the chamber 612 and then controls the high frequency power source 617 to apply a high frequency bias to the substrates 301 and 302 to perform the $O_2$ RIE treatment on the joint surface of each of the substrates 301 and 302. As a result, it is possible to improve the joint strength of the joined substrates 301 and 302. The strength went up presumably because the $O_2$ RIE treatment served for the wettability to go up and to remove organic substances that had adhered to the joint surfaces of the substrates 301 and 302, whereby the $N_2$ RIE treatment was performed in the absence of contaminants. Conversely, an attempt of the reversed processing (the $N_2$ RIE treatment→the $O_2$ RIE treatment) resulted in a deteriorated wettability and a lower strength than the separate processing. The effect of reaction due to the order of the $O_2$ RIE treatment→the $N_2$ RIE treatment is presumable. From the above results, it is understood that execution of the processing in the order of the $O_2$ RIE treatment→the $N_2$ RIE treatment→the $N_2$ radical treatment is effective in improving the mutual joint strength of the substrates 301 and 302.

An embodiment of the present disclosure is described above. However, the present disclosure is not restricted to the configuration of the above-described embodiment. For example, a configuration in which the hydrophilic treatment device produces $N_2$ radicals by inductively coupled plasma (ICP) may be contemplated. For example, as shown in FIG. 12, a hydrophilic treatment device 2600 has the stage 610, a chamber 2612, a solenoid coil 2616, and the high frequency power source 617. Here, in FIG. 12, the similar configurations to those in the embodiment are referred to by the same reference numbers as in FIG. 2. The $N_2$ gas reservoir 621A is connected to the chamber 2612 via the supply valve 622A and the supply pipe 623A. Moreover, the $O_2$ gas reservoir 621B is also connected to the chamber 2612 via the supply valve 622B and the supply pipe 623B. Moreover, the chamber 2612 is connected to the vacuum pump 201 via the discharge pipe 202A and the discharge valve 203A.

The solenoid coil 2616 is supplied with a high frequency current of, for example, 27.12 MHz. Then, as the high frequency current flows through the solenoid coil 2616 with $N_2$ gas introduced within the chamber 2612, high density plasma PLM is formed within the chamber 2612. Here, ions in the plasma PLM are trapped by the magnetic field that is produced by the solenoid coil 2616 and only radicals in the plasma PLM flow down to the stage 610.

Here, the hydrophilic treatment that is executed by the substrate joining system (the controller of the substrate joining system) according to this modified embodiment will be described in detail with reference to FIG. 6. First, the controller controls the $O_2$ gas supplier 620B to introduce $O_2$ gas into the chamber 2612 (Step S21). Next, with the high frequency current flowing through the solenoid coil 2616, the controller applies a high frequency bias to the substrates 301 and 302 that are held on the stage 610 by means of the high frequency power source 617. In this way, the $O_2$ RIE treatment is performed on the joint surfaces of the substrates 301 and 302 (Step S22).

Subsequently, the controller discharges the $O_2$ gas within the chamber 2612 and then controls the $N_2$ gas reservoir 620A to introduce $N_2$ gas into the chamber 2612 (Step S23). Subsequently, with the high frequency current flowing through the solenoid coil 2616, the controller controls the high frequency power source 617 to apply a high frequency bias to the substrates 301 and 302. In this way, the $N_2$ RIE treatment is performed on the joint surfaces of the substrates 301 and 302 (Step S24).

Next, with the high frequency current flowing through the solenoid coil 2616, the hydrophilic treatment device 2600 controls the high frequency power source 617 to sop application of the high frequency bias to the substrates 301 and 302. In this way, the $N_2$ radical treatment (the radical treatment step) is performed on the joint surfaces of the substrates 301 and 302 (Step S25). Subsequently, the above-described processing of the Step S3 in FIG. 5 is executed.

This configuration makes it possible to form higher density plasma PLM in the chamber 2612 than the plasma PLM that can be produced by the hydrophilic treatment device 600 according to Embodiment 1. Thus, it is possible in the $N_2$ radical treatment to increase the supply amount of $N_2$ radicals per unit time that are supplied to the joint surfaces of the substrates 301 and 302 and thus increase the amount of $N_2$ radicals, which is more effective to improve the joint strength of the substrates 301 and 302.

Moreover, the embodiment is described with regard to the case in which the hydrophilic treatment is performed on both of the two substrates 301 and 302. However, this is not restrictive. For example, a configuration in which the hydrophilic treatment is performed on only one of the two substrates 301 and 302 may be contemplated.

Furthermore, the embodiment is described with regard to the case in which the substrates 301 and 302 are any of glass substrates, oxide substrates, and nitride substrates. However, there is no restriction to cases in which both of the substrates 301 and 302 are any of glass substrates, carbide substrates, ceramic substrates, oxide substrates, and nitride substrates and for example, one of the substrates 301 and 302 may be another kind of substrate such as a Si substrate and a sapphire substrate.

Furthermore, the embodiment is described with regard to the case in which with the entire joint surfaces of the substrates 301 and 302 being in contact with each other, the substrate joining device 100 pressurizes the substrates 301 and 302 and heats the substrates 301 and 302 by means of the substrate heaters 421 and 422. However, this is not restrictive. For example, a configuration in which with the entire joint surfaces of the substrates 301 and 302 being in contact with each other, the substrate joining device 100 only pressurizes, does not heat, the substrates 301 and 302 may be contemplated. Alternatively, a configuration in which with the entire joint surfaces of the substrates 301 and 302 being in contact with each other, the substrate joining device 100 only heats, does not pressurize, the substrates 301 and 302 may be contemplated.

The embodiment is described with regard to the case in which the substrate joining device 100 pressurizes and heats the substrates 301 and 302. This configuration is not restrictive. A configuration in which a device that is different from the substrate joining device 100 pressurizes/heats the substrates 301 and 302 may be contemplated. For example, a configuration in which the substrate joining device 100 executes up to temporary joining of the substrates 301 and 302 and subsequently, another heating device (not shown) executes the heat treatment may be contemplated. In such a case, the heat treatment is set for a condition of 180° C. for two hours or so. This results in improving the production efficiency.

The embodiment is described with regard to the configuration in which the substrates 301 and 302 are joined together in a vacuum. However, this is not restrictive. A configuration in which the substrates 301 and 302 are joined together under the atmospheric pressure or a configuration in which the substrates 301 and 302 are joined together in an atmosphere that is filled with any gas may be contemplated.

Moreover, the embodiment is described with regard to the case in which the cleaning of the substrates 301 and 302 is performed in the cleaning device 940, then the hydrophilic treatment on the joint surfaces of the substrates 301 and 302 is executed in the hydrophilic treatment device 600, and subsequently the joining process of the substrates 301 and 302 is executed in the substrate joining device 100. However, the order of the cleaning, the hydrophilic treatment, and the joining process of the substrates 301 and 302 is not restricted to the above. For example, it may be possible to execute the hydrophilic treatment on the joint surfaces of the substrates 301 and 302, perform the cleaning of the substrates 301 and 302, and subsequently execute the joining process of the substrates 301 and 302.

Furthermore, the embodiment is described with regard to the configuration in which the water supply process to expose the joint surfaces of the substrates 301 and 302 to water gas ($H_2O$) is performed in the load lock chamber 910 without opening the load lock chamber 910 to the atmosphere. However, the place where the joint surfaces of the substrates 301 and 302 are exposed to water gas is not restricted to the load lock chamber 910. For example, a configuration in which the joint surfaces of the substrates 301 and 302 are exposed to water gas in the hydrophilic treatment device 600 may be contemplated. In such a case, a configuration in which the above-described water gas generation device is connected to the chamber 612 of the hydrophilic treatment device 600 via a supply valve and a supply pipe may be contemplated. Moreover, a configuration in which the water supply process is performed within the chamber 200 of the substrate joining device 100 or within a chamber that is possessed by the second transportation device 920 may be contemplated. Alternatively, a substrate joining method by which the substrates 301 and 302 are transported to the load lock chamber 910 and then the load lock chamber 910 is opened to the atmosphere to supply moisture to the joint surfaces of the substrates 301 and 302 in the substrate joining method according to the embodiment may be contemplated. In such a case, the atmosphere that is present outside the load lock chamber 910 and has a given humidity is introduced into the load lock chamber 910. Then, in order to prevent unfavorable contaminants (for example, carbon) in the atmosphere from adhering to the joint surfaces of the substrates 310 and 302 while introducing the atmosphere into the load lock chamber 910, it is preferable that the load lock chamber 910 has a configuration in which the atmosphere is introduced into the load lock chamber 910 through a given filter. Then, after opening the load lock chamber 910 to the atmosphere, it is merely required to depressurize the load lock chamber again and subsequently transport the substrates 301 and 302 from the load lock chamber 910 to the substrate joining device 100. With this configuration, there is no need of connecting the water gas supplier 960 to the load lock chamber 910 and thus the configuration of the substrate joining system can be simplified.

Alternatively, the substrate joining method may be configured to perform the water supply process to expose the joint surfaces of the substrates 301 and 302 to water gas in the load lock chamber 910 without opening the load lock chamber 910 to the atmosphere and then open the load lock chamber 910 to the atmosphere.

The embodiment is described with regard to the configuration in which the water supply process to supply water gas ($H_2O$) to the joint surfaces of the substrates 301 and 302 is performed. However, this is not restrictive and for example, gas containing H and OH groups may be supplied to the joint surfaces of the substrates 301 and 302 in place of water gas.

The embodiment is described with regard to the case in which immediately after the $O_2$ RIE treatment is performed on the joint surfaces of the substrates 301 and 302, $O_2$ gas is discharged from and $N_2$ gas is introduced into the chamber 2612 to perform the $N_2$ RIE treatment on the joint surfaces of the substrates 301 and 302. However, this is not restrictive and for example, it may be possible to supply gas containing at least one of $H_2O$, H and OH groups into the chamber 2612 after performing the $O_2$ RIE treatment and then perform the $N_2$ RIE treatment on the joint surfaces of the substrates 301 and 302. Moreover, it may also be possible to perform the water supply step of supplying gas containing at least one of $H_2O$, H, and OH groups to the joint surfaces of the substrates 301 and 302 (the second water supply step) after the step of performing the $N_2$ RIE treatment (the first etching step). Then, after this water supply step, the $N_2$ RIE treatment is performed on the joint surfaces of the substrates 301 and 302.

During the $N_2$ RIE treatment and/or during the $N_2$ radical treatment, because of a high degree of vacuum within the chamber 2612 and an insufficient amount of water molecules present within the chamber 2612, a sufficient amount of OH groups may not be produced on the joint surfaces of the substrates 301 and 302 in some cases. On the other hand, with this configuration, gas containing $H_2O$ or H, OH groups is supplied to the joint surfaces of the substrates 301 and 302 after the $O_2$ RIE and/or after the $N_2$ RIE treatment. As a result, it is possible to increase the amount of water molecules that are present in the vicinity of the joint surfaces of the substrates 301 and 302 and thus produce a sufficient amount of OH groups on the joint surfaces of the substrates 301 and 302. Moreover, the $N_2$ RIE treatment and/or the $N_2$ radical treatment is performed on the joint surfaces of the substrates 301 and 302 with $H_2O$ adhering to the joint surfaces of the substrates 301 and 302, whereby $H_2O$ adhering to the joint surfaces of the substrates 301 and 302 turns into plasma and active OH groups easily adhere to the joint surfaces of the substrates 301 and 302. Alternatively, active H can produce OH groups on the surfaces of oxides that are formed on the joint surfaces of the substrates 301 and 302. In this way, it is possible to increase the amount of OH groups that are produced on the joint surfaces of the substrates 301 and 302. Moreover, preferably, it is possible to realize the subsequent plasma treatment without once discharging the gas containing $H_2O$ or H, OH groups by adding the water supply step of supplying gas containing $H_2O$ or H, OH groups after the $O_2$ RIE treatment and subsequent discharge of $O_2$ gas and introduction of $N_2$ gas. Moreover, preferably, it is possible to perform the radical treatment with a large amount of gas containing $H_2O$ or H, OH groups and produce a sufficient amount of OH groups by adding the water supply step of supplying gas containing $H_2O$ or H, OH groups after the $N_2$ RIE treatment and before the $N_2$ radical treatment so as to realize the subsequent plasma treatment without once discharging for exchanging the gas. Moreover, this may be performed both between the $O_2$ RIE treatment and the $N_2$ RIE treatment and between the $N_2$ RIE treatment and the $N_2$ radical treatment.

The embodiment is described with regard to the configuration in which a cooling device for cooling the stage that supports the substrates 301 and 302 is provided in the load lock chamber 910. However, this is not restrictive and a configuration in which no cooling device is provided in the load lock chamber 910 may be contemplated.

The embodiment is described with regard to the case in which the heat treatment to heat the substrates 301 and 302 is performed in the substrate joining device 100. However, the configuration in which the heat treatment is performed in the substrate joining device 100 is not restrictive. For example, a configuration in which the joining process (temporary joining) is performed in the substrate joining device 100, and then, the heat treatment is performed on the substrates 301 and 302 in an annealing furnace (not shown) that is a separate body from the substrate joining device 100 may be contemplated.

The embodiment is described with regard to the case in which the substrates 301 and 302 that are glass substrates are joined together. This is not restrictive, and one of the substrates 301 and 302 may be a Si substrate. Moreover, the same effect as the embodiment is obtained even when one of the substrates 301 and 302 is a Si substrate, the other is a glass substrate, and the substrates 301 and 302 are anodically joined together.

Moreover, when one of the substrates 301 and 302 is a Si substrate, and the other is a glass substrate, it may be possible to perform the conventional hydrophilic treatment on the joint surface of the Si substrate (for example, the process according to Comparative Embodiments 1 to 4) and perform the hydrophilic treatment according to the embodiment only on the Joint surface of the glass substrate. Furthermore, the substrates 301 and 302 are not restricted to glass substrates and may be Si substrates, substrates on which an oxide film is formed, substrates on which a nitride film is formed, carbide substrates, or ceramic substrates. Moreover, the substrates 301 and 302 may be a combination of two substrates that are selected from among a glass substrate, a Si substrate, a substrate on which an oxide film is formed, a substrate on which a nitride film is formed, a carbide substrate, and a ceramic substrate.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

The present application is based on Japanese Patent Application No. 2016-217582, filed on Nov. 7, 2016. The specification, the scope of claims, and the drawings of the Japanese Patent Application No. 2016-217582 are entirely incorporated herein by reference.

INDUSTRIAL APPLICABILITY

The present disclosure is preferable for manufacturing; for example, complementary MOS (CMOS) image sensors and memories, arithmetic operation elements, and micro electro mechanical systems (MEMS).

REFERENCE SIGNS LIST

100 Substrate joining device
200, 612, 2612 Chamber
201 Vacuum pump
202A, 202B Discharge pipe
203A, 203B Discharge valve
301, 302 Substrate
401, 610, 803 Stage
402 Head
403 Stage driver
404 Head driver
408 Pressure sensor
421,422 Substrate heater
500 Misalignment amount measurer
600, 2600 Hydrophilic treatment device
613 Glass window
614 Trap plate
615 Waveguide
616 Magnetron
617 High frequency power source
620A $N_2$ gas supplier
620B $O_2$ gas supplier
621A $N_2$ gas reservoir
621B $O_2$ gas reservoir
622A, 622B Supply valve
623A, 623B Supply pipe
700 Controller
701 MPU
702 Main storage
703 Auxiliary storage
704 Interface
705 Bus
800 Contour alignment device
802 Substrate thickness measurer
810 Edge recognition sensor
910 Load lock chamber
920 Second transportation device
930 First transportation device 921 Vacuum transportation robot
931 Atmospheric transportation robot
940 Cleaning device
950 Flipping device
960 Water gas supplier
961 Introduction port
962 Retrieval port
2616 Solenoid coil

The invention claimed is:

1. A substrate joining method for joining two substrates, including:
a hydrophilic treatment step of hydrophilizing at least one of respective joint surfaces of the two substrates that are to be joined to each other, and
a joining step of joining the two substrates after the hydrophilic treatment step,
wherein the hydrophilic treatment step includes:
a first etching step of performing reactive ion etching using nitrogen gas on the at least one of the joint surfaces of the substrates, and
a radical treatment step of performing a radical treatment to irradiate the at least one of the joint surfaces of the substrates with nitrogen radicals after the first etching step.

2. The substrate joining method according to claim 1, wherein
the hydrophilic treatment step further includes a second etching step of performing reactive ion etching using oxygen gas on the at least one of the joint surfaces of the substrates before the first etching step.

3. The substrate joining method according to claim 2, wherein
the hydrophilic treatment step further includes a second water supply step of supplying gas containing at least one of H2O, H, and OH groups to the at least one of the joint surfaces of the substrates after the first etching step or after the second etching step.

4. The substrate joining method according to claim 3, wherein
the joining step is performed in a vacuum.

5. The substrate joining method according to claim 3, wherein
at least one of the two substrates is each any of a glass substrate, a carbide substrate, a ceramic substrate, an oxide substrate, and a nitride substrate.

6. The substrate joining method according to claim 2, wherein
the joining step is performed in a vacuum.

7. The substrate joining method according to claim 2, wherein
at least one of the two substrates is each any of a glass substrate, a carbide substrate, a ceramic substrate, an oxide substrate, and a nitride substrate.

8. The substrate joining method according to claim 1, further including:
a first water supply step of supplying gas containing at least one of H2O, H, and OH groups to the at least one of the joint surfaces of the substrates after the hydrophilic treatment step.

9. The substrate joining method according to claim 8, wherein
the joining step is performed in a vacuum.

10. The substrate joining method according to claim 8, wherein
at least one of the two substrates is each any of a glass substrate, a carbide substrate, a ceramic substrate, an oxide substrate, and a nitride substrate.

11. The substrate joining method according to claim 1, wherein
the joining step is performed in a vacuum.

12. The substrate joining method according to claim 11, wherein
at least one of the two substrates is each any of a glass substrate, a carbide substrate, a ceramic substrate, an oxide substrate, and a nitride substrate.

13. The substrate joining method according to claim 1, wherein
at least one of the two substrates is each any of a glass substrate, a carbide substrate, a ceramic substrate, an oxide substrate, and a nitride substrate.

14. A substrate joining system for joining two substrates, comprising:
a hydrophilic treatment device configured to perform a hydrophilic treatment to hydrophilize at least one of respective joint surfaces of the two substrates that are to be joined to each other;
a substrate joining device configured to join the two substrates of which the joint surfaces are subjected to the hydrophilic treatment by the hydrophilic treatment device; and
a controller configured to control the hydrophilic treatment device and the substrate joining device,
wherein the hydrophilic treatment device comprises:
a chamber;
a stage configured to support the substrates within the chamber;
a nitrogen gas supplier configured to supply nitrogen gas into the chamber;
a plasma generation source configured to generate plasma and supply radicals in the plasma to the joint surfaces of the substrates that are supported by the stage; and
a bias applier configured to apply a high frequency bias to the substrates that are supported by the stage, and
the controller is configured to
control the nitrogen gas supplier to introduce nitrogen gas into the chamber and then control the bias applier to apply a high frequency bias to the substrates to perform reactive ion etching using nitrogen gas on the at least one of the joint surfaces of the substrates, and then control the plasma generation source and the bias applier to generate plasma with the nitrogen gas and stop the application of the high frequency bias to the substrates to perform a radical treatment to irradiate the at least one of the joint surfaces of the substrates with nitrogen radicals.

15. The substrate joining system according to claim 14, wherein
the hydrophilic treatment device further comprises an oxygen gas supplier configured to supply oxygen gas into the chamber, and
the controller is configured to control the oxygen gas supplier to introduce oxygen gas into the chamber and then control the bias applier to apply a high frequency bias to the substrates to perform reactive ion etching using oxygen gas on the at least one of the joint surfaces of the substrates.

16. A method for controlling a hydrophilic treatment device that comprises a chamber, a stage configured to support substrates within the chamber, a nitrogen gas supplier configured to supply nitrogen gas into the chamber, a plasma generation source configured to generate plasma and supply radicals in the plasma to joint surfaces of the substrates that are supported by the stage, and a bias applier configured to apply a high frequency bias to the substrates that are supported by the stage, including:
- a step of introducing nitrogen gas into the chamber by means of the nitrogen gas supplier and then applying a high frequency bias to the substrates by means of the bias applier to perform reactive ion etching using nitrogen gas on the joint surfaces of the substrates, and
- a step of generating plasma with nitrogen gas by means of the plasma generation source and stopping the application of the high frequency bias to the substrates by means of the bias applier to perform a radical treatment to irradiate the joint surfaces of the substrates with nitrogen radicals.

17. The hydrophilic treatment device control method according to claim 16, wherein
- the hydrophilic treatment device further comprises an oxygen gas supplier configured to supply oxygen gas into the chamber, and
- the method further includes a step of introducing oxygen gas into the chamber by means of the oxygen gas supplier and applying a high frequency bias to the substrates by means of the bias applier to perform reactive ion etching using oxygen gas on the joint surfaces of the substrates.

\* \* \* \* \*